(12) United States Patent
Birkner et al.

(10) Patent No.: US 10,322,919 B2
(45) Date of Patent: Jun. 18, 2019

(54) MAINTENANCE APPARATUS

(71) Applicant: Integrated Dynamics Engineering GmbH, Raunheim (DE)

(72) Inventors: Andreas Birkner, Jena (DE); Simon Schadt, Wiesbaden (DE); Arndt Evers, Oestrich-Winkel (DE)

(73) Assignee: Integrated Dynamics Engineering GmbH, Raunheim (DE)

(*) Notice: Subject to any disclaimer, the term of this patent is extended or adjusted under 35 U.S.C. 154(b) by 104 days.

(21) Appl. No.: 15/449,415

(22) Filed: Mar. 3, 2017

(65) Prior Publication Data

US 2017/0267504 A1 Sep. 21, 2017

(30) Foreign Application Priority Data

Mar. 15, 2016 (EP) ..................... 16160367

(51) Int. Cl.
| | |
|---|---|
| *B25J 15/00* | (2006.01) |
| *B25J 18/02* | (2006.01) |
| *B66C 23/20* | (2006.01) |
| *B66F 9/12* | (2006.01) |
| *B66F 7/00* | (2006.01) |
| *B66F 9/10* | (2006.01) |
| *H01L 21/677* | (2006.01) |

(52) U.S. Cl.
CPC ............ *B66F 7/00* (2013.01); *B25J 15/0014* (2013.01); *B25J 18/025* (2013.01); *B66C 23/208* (2013.01); *B66F 9/10* (2013.01); *B66F 9/12* (2013.01); *H01L 21/67742* (2013.01)

(58) Field of Classification Search
CPC ..... B25J 15/0014; B25J 18/025; B66C 23/20; B66C 23/208; B66C 23/26; B66C 23/701; B66F 9/10; B66F 9/12; B66F 9/125; B66F 9/14; B66F 9/142; B66F 9/147; B66F 9/148; B66F 9/149; B66F 9/165
See application file for complete search history.

(56) References Cited

U.S. PATENT DOCUMENTS

| | | | | |
|---|---|---|---|---|
| 3,715,046 | A * | 2/1973 | Marklund | B60P 1/4421 414/631 |
| 4,005,782 | A * | 2/1977 | Crockett | B21D 43/105 414/591 |
| 4,242,025 | A * | 12/1980 | Thibault | B65G 61/00 414/792 |
| 4,543,031 | A * | 9/1985 | Luebrecht | B66F 9/10 414/631 |

(Continued)

FOREIGN PATENT DOCUMENTS

| | | | | |
|---|---|---|---|---|
| DE | 102008016881 A1 | * | 1/2010 | ............... B66F 9/14 |
| JP | 2005294280 A | | 10/2005 | |

*Primary Examiner* — James Keenan
(74) *Attorney, Agent, or Firm* — Kaplan Breyer Schwarz, LLP

(57) ABSTRACT

A maintenance apparatus, in particular for lifting and moving components of a system for processing semiconductor devices. The apparatus comprises a beam and an arm with means for lifting a component, the arm being mounted to the beam via a connecting unit and so as to be pivotable in a horizontal plane, wherein the connecting unit is displaceable along the beam, and wherein the arm is displaceable perpendicularly to the beam, and wherein a load accommodation means is provided on the pivotable arm.

12 Claims, 25 Drawing Sheets

(56) References Cited

U.S. PATENT DOCUMENTS

| | | | |
|---|---|---|---|
| 5,102,283 A * | 4/1992 | Balzola Elorza | B65G 1/1375 |
| | | | 414/404 |
| 5,893,795 A | 4/1999 | Perlov et al. | |
| 6,041,949 A * | 3/2000 | Walker | B66C 9/08 |
| | | | 212/179 |
| 6,508,617 B1 * | 1/2003 | Gressett | B25J 9/026 |
| | | | 414/626 |
| 6,709,225 B1 * | 3/2004 | Pitts | H01L 21/67766 |
| | | | 414/267 |
| RE39,997 E * | 1/2008 | Parnes | B60P 3/122 |
| | | | 414/501 |
| 8,137,048 B2 * | 3/2012 | Chidambaram | B25J 9/107 |
| | | | 414/744.2 |
| 8,167,153 B1 * | 5/2012 | Wattel | B66C 23/166 |
| | | | 182/45 |
| 8,950,604 B2 * | 2/2015 | Drader | B66C 5/04 |
| | | | 212/331 |
| 9,008,825 B2 * | 4/2015 | Benjamin | B65G 47/04 |
| | | | 700/213 |
| 9,156,614 B2 * | 10/2015 | Ono | H02B 3/00 |
| 2010/0114363 A1 * | 5/2010 | Cardoni | B25J 9/1612 |
| | | | 700/218 |
| 2010/0193711 A1 | 8/2010 | Watanabe et al. | |
| 2011/0262252 A1 | 10/2011 | Lee et al. | |
| 2013/0051957 A1 | 2/2013 | Lee et al. | |
| 2013/0088702 A1 | 4/2013 | Peijster | |
| 2017/0129751 A1 * | 5/2017 | Cisnero | B66C 23/201 |

\* cited by examiner

MAINTENANCE APPARATUS

European Patent Application No. 16 160 367.5, filed on Mar. 15, 2016, is incorporated herein by reference.

FIELD OF THE INVENTION

The invention relates to a maintenance apparatus which is in particular adapted for lifting and moving components of a system for processing semiconductor devices, more particularly components of a metrology system, of a lithography system, or components of a processing system. The maintenance apparatus is intended for lifting such components and displacing them horizontally. The system is intended to be employed in particular in clean rooms.

BACKGROUND OF THE INVENTION

In the semiconductor industry, substrates are becoming larger and larger and so do the systems for processing the substrates, such as e.g. lithography systems, optical inspection devices, etc.

This may concern substrate handling components, light source components, components of an electron beam source or of a measurement sensor, or a combination of such components. For maintenance purposes, it is necessary to lift the respective system component and to displace it laterally in order to get access to the devices or components located therebelow or to inspect the displaced component itself.

For this purpose, mobile maintenance cranes are mostly used in practice. Such cranes are cumbersome to operate, and it is often difficult to access the relevant system components. In particular it is often necessary to first move away several system components in order to reach an underlying system component.

This accordingly causes cost-intensive downtimes of the system. Furthermore, there is the risk of contamination or damage to the system or components thereof. Moreover, depending on for example the weight, shape, and position of the system and of the system components to be moved, measures have to be taken to ensure safety and ergonomics compliance for the maintenance personnel performing the work.

Published patent application US 2013/0088702 A2 discloses a lifting assembly for a module of a lithography device, which is integrated into the system and therefore is said to have the advantage of shorter maintenance times. A drawback of this assembly is that it is not very flexible and is an integral component of the system, i.e. the lifting assembly described in the document is individually manufactured for a specific lifting task and it is difficult to flexibly employ such an assembly for lifting different system parts.

OBJECT OF THE INVENTION

Given this background, the invention is based on the object of mitigating the drawbacks of the prior art. More particularly it is intended to provide a maintenance apparatus which can be employed to move even heavy loads and which can otherwise be used flexibly and which is of simple and compact configuration.

The invention in particular relates to a maintenance apparatus which permits to move system components in a short time, with low system contamination, in safe and ergonomic manner as concerns the personnel, and in safe manner for the system and the system components.

SUMMARY OF THE INVENTION

The object of the invention is already achieved by a maintenance apparatus in accordance with an illustrative embodiment of the present invention.

The invention relates to a maintenance apparatus which is in particular adapted for lifting and moving components of a system for processing semiconductor devices. The maintenance apparatus of the invention is especially suitable for clean rooms.

The maintenance apparatus is in particular designed for moving weights of at least 5 kg, preferably at least 50 kg, most preferably at least 500 kg. For this purpose, the maintenance apparatus is provided as an automated tool which is permanently or temporarily integrated in the machine or system.

The maintenance apparatus comprises a beam and an arm with means for lifting a component. The arm is mounted to the beam so as to be pivotable in a horizontal plane, via a connecting unit, and the connecting unit is displaceable along the beam, and the arm is displaceable perpendicularly to the beam in a vertical direction.

Thus, the invention relates to an arm which can be pivoted away from a beam in a horizontal direction and which is connected to the beam in particular by means of a hinge.

This hinge may in particular be part of the connecting unit.

It will be appreciated that "horizontal" and "vertical" refer to the orientation of the constituent parts of the maintenance apparatus in its installed state.

With a pivoting movement, the arm can be moved from one side to above a system and its components.

In one embodiment, this pivoting movement is effected manually. In another embodiment, an actuator, in particular a motor, is provided for the pivoting movement.

Preferably, a pivoting movement through at least 90° is possible relative to the beam. According to another embodiment, it is possible to perform a pivoting movement through 180°. So the arm can be arranged in two orientations, with either of its opposite sides against the beam.

A connecting unit of any desired configuration can be moved horizontally along the main extension direction of the beam. This may be implemented using a linear motor, a direct drive, a magnetic or air bearing, or a threaded spindle, for example.

Furthermore, the arm can be moved perpendicularly to the beam, in a vertical direction.

This may in particular be implemented by providing the connecting unit with an arm seat for the arm and a beam seat. The arm seat is displaceable rectilinearly relative to the beam seat in a vertical direction. This may again be implemented using the aforementioned components, such as e.g. a threaded spindle or a linear drive.

The vertical displaceability serves to lift the respective system component by means of the arm. For this purpose, a rather low lifting height will usually be sufficient, which means that the connecting unit along which the arm can be moved vertically has a shorter length than the beam.

The arm and/or the beam are preferably provided as rails, in particular metal rails.

In an alternative embodiment, fiber composite materials such as carbon fiber components can be utilized to provide for a particularly light-weight configuration of the maintenance apparatus.

The maintenance apparatus furthermore has a load accommodation means for the component.

Load accommodation means refers to a means for fixing and lifting the component which is to be moved into or out of the system area. This may for example be a screw connection, a gripper, or a fork.

On the one hand, the maintenance apparatus of the invention implies a high degree of flexibility, in particular almost any component of a system can be moved given an appropriate dimensioning of the beam and arm.

On the other hand, the maintenance apparatus can preferably be folded together into a portable unit. Furthermore, according to one embodiment, the maintenance apparatus can be folded together so as to occupy minimum space in a system.

In particular it is possible to provide a maintenance apparatus which can be used to move heavy loads, but at the same time can be transported to and installed at the system by a single person.

In one embodiment, the maintenance apparatus may comprise a case, for example a trolley case, and the maintenance apparatus folded into a portable unit is arranged in the case and can thus be transported to the system using the case.

According to a preferred embodiment of the invention, the arm and/or the load accommodation means is configured so as to be detachable. Thus, the maintenance apparatus can be easily adapted by replacing the arm and/or the load accommodation means. The maintenance apparatus can be adapted in this manner so as to be able to lift different components.

The maintenance apparatus is preferably designed so as to be suitable for clean rooms. According to one embodiment of the invention, the maintenance apparatus comprises lubricant-free joints, rails, and/or bearings for this purpose.

Besides lubricant-free components having sliding surfaces, these may include magnetic bearings or air bearings, for example.

"Lubricant-free" means dispensing with liquid and in particular grease or oil containing spread agents.

Sliding surfaces preferably have a sliding coating. Besides elastomer materials, this may as well include bearings and rails with a hard material coating, in particular of diamond-like carbon (DLC).

According to one embodiment of the invention, the arm comprises at least two extendable segments.

These segments may preferably be telescoped together, thus providing for an enlarged radius of action and at the same time small dimensions in the folded state.

In a preferred embodiment of the invention, the arm is designed to be rotatable via the connecting unit.

This means that the arm can be rotated about a horizontal axis that extends perpendicular to the beam.

This makes it possible, on the one hand, to rotate the arm through 180° in order to orient an accommodation means which is provided on only one side, into the other direction, for some system component.

On the other hand it is made possible in this way that the arm can not only be pivoted over the system horizontally, but may also be oriented in vertical alignment, downwards or upwards.

In this manner it is possible to move very heavy system components such as a granite slab, for example, using a compactly configured maintenance apparatus, since in this vertical position of the arm there is no appreciable leverage effect on the arm.

For lifting heavy loads, it is in particular contemplated to use two maintenance apparatuses positioned diametrically opposite to each other and approaching the edge of the relevant component from both sides without need to swivel the arm over the component.

For system components of lower weight, on the other hand, a single maintenance apparatus will be sufficient. The arm is horizontally pivoted over the system to be able to reach components anywhere.

For lifting system components, the load accommodation means may preferably include fold-out forks, as contemplated according to a preferred embodiment. The forks are connected to the arm.

In one embodiment of the invention, the forks are displaceable along the arm. The forks may in particular serve to lift system components of rather low weight. Preferably, the forks may moreover be mounted on the arm for rotation, so that they can be arranged in parallel to the arm by a simple rotary movement and can be folded together in order to again provide for a compactly dimensioned module in the folded state.

In one embodiment of the invention, the arm has a further accommodation means for a component, which is preferably arranged on a side of the arm facing away from the forks.

This may in particular be a support such as an elbow, for example.

Preferably, this accommodation means facing away from the fork is provided for lifting heavier loads, in particular loads for which the arms are vertically aligned during lifting.

In a further embodiment of the invention, the maintenance apparatus and in particular a trajectory of the maintenance apparatus can be programmed using a data item or data set provided on the system side.

In particular it is contemplated to assign an individual identifier to the respective apparatus from the system side.

In the simplest case, this can be a number which is manually entered into a controller of the maintenance apparatus.

Preferably, the maintenance apparatus is equipped with a reader which is adapted to read a data set provided on the system side. This may be implemented in the form of an RFID system or in the form of a barcode, for example.

In this manner the maintenance apparatus can adapt itself to a respective system when being installed in that system, for example by uploading individual motion profiles that are retrievable from a memory.

The invention furthermore relates to a system which is in particular adapted for processing semiconductor devices.

The system comprises a maintenance apparatus which can be mounted to the system. The maintenance apparatus is in particular mountable to a frame of the system.

The maintenance apparatus furthermore comprises means for lifting a component.

The feature of being mountable to the system means that the maintenance apparatus can be temporarily connected to the system.

In contrast to prior art cranes, the maintenance apparatus is a component of the system in its mounted state but can be removed, so as to be mounted only when required.

The costs of providing such a maintenance apparatus are substantially reduced in this manner.

Furthermore, equipment that is an integral component of the system need not be separately certified in most cases.

The system comprises a maintenance apparatus which preferably comprises at least one beam and at least one load accommodation means that is adapted to lift a component located in the system area.

The load accommodation means is adapted to be able to perform at least a vertical and a horizontal movement relative to the beam.

The maintenance apparatus is preferably a maintenance apparatus as has been described above.

As contemplated according to a preferred embodiment, the maintenance apparatus is mounted by means of a system-side accommodation means.

In particular it is contemplated that the system comprises a frame to which the beam can be secured.

This may in particular be done by means of a quick-release clamping mechanism.

For lifting rather heavy components, the system may comprise two opposing maintenance apparatuses.

The invention further relates to a method for lifting and moving a component, in particular a component of a system for processing semiconductor devices. For this purpose, a maintenance apparatus or a system as described above is used.

According to a further embodiment of the invention it is contemplated that the movement is performed along a trajectory, using a controller.

In particular, it is contemplated that the controller comprises a memory that stores trajectories. In this way, the component to be moved can be easily driven past obstacles.

Alternatively, the controller may comprise an input device by means of which the maintenance apparatus is directly controlled. The controller may in particular be configured so as to comprise a joystick or keyboard or a touchscreen.

The invention in particular contemplates that the maintenance apparatus comprises a controller by means of which the load accommodation means can be moved in two horizontal directions in space.

If the load accommodation means is intended to be moved rectilinearly, this would be difficult if the controller is directly controlled, that is when it performs a rotational movement when being controlled.

The maintenance apparatus is therefore adapted so that a translational movement in some direction can be predetermined via the controller, for example by moving the joystick in some direction, and so that via preprogrammed movement profiles an overall substantially translational movement is produced from the pivotal movement of the arm and at least one further linear movement such as the translational movement of the connecting unit.

According to one embodiment of the invention, the controller of the maintenance apparatus may be coupled wirelessly to a control unit, in particular via a WiFi or Bluetooth connection. This wirelessly coupled control unit may be a smartphone, a laptop computer, or a tablet computer, for example.

However, the controller may as well be connected to a wired control unit. The separate provision of control unit and controller has the advantage that maintenance work can be performed more easily. The control unit may as well have position or acceleration sensors, so that the maintenance apparatus may be controlled via gestures, for example.

Preferably, an already existing computer can be used as the controller, which may in particular also be provided as a tablet computer or smartphone.

BRIEF DESCRIPTION OF THE DRAWINGS

The subject matter of the invention will now be explained in more detail by way of exemplary embodiments and with reference to the drawings of FIGS. 1 to 40.

FIG. 24 is a view of a detail of the maintenance apparatus used in FIG. 23.

DETAILED DESCRIPTION

Figure 1:
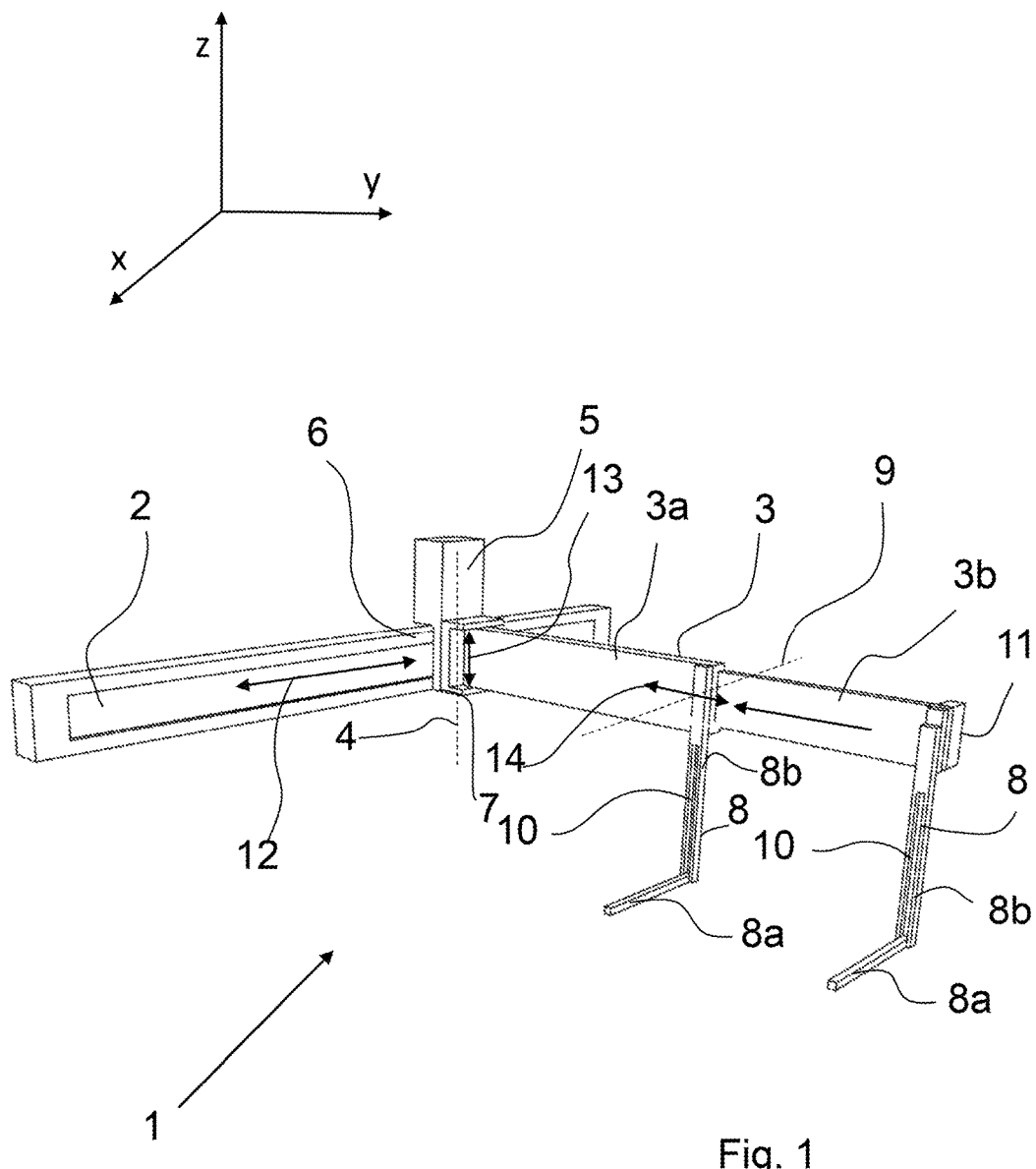
FIG. 1 is a perspective view of an exemplary embodiment of a maintenance apparatus according to the invention.

FIG. 1 shows a first exemplary embodiment of a maintenance apparatus 1. The maintenance apparatus 1 comprises a beam 2 which is adapted for being mounted to a system for processing semiconductor devices, for example.

Beam 2 has a rail-like configuration and may be aligned horizontally in the installed state of the maintenance apparatus, that means the main extension direction of beam 2 lies horizontally. In this view with the coordinate system indicated this is the x-y plane. The spatial direction designated z is the vertical direction in space in the sense of the invention.

An arm 3 is pivotably mounted to beam 2 via a connecting unit 5 which may include a vertical drive for an arm seat 7.

In this exemplary embodiment, arm 3 is mounted to beam 2 so as to be pivotable horizontally, that is to say about axis 4. For this purpose, the connecting unit 5 includes a hinge.

In this exemplary embodiment, the arm 3 can be pivoted through 180°, so it can be pivoted to abut against beam 2 with either side thereof.

Connecting unit 5 further comprises an arm seat 7 and a beam seat 6.

Beam seat 6 can be moved horizontally along beam 2. The corresponding movement is symbolized by arrow 12.

Furthermore, the arm seat 7 can be moved vertically relative to beam seat 6, which is symbolized by arrow 13.

By raising arm seat 7, the arm 3 and hence a component to be moved is lifted and can then be moved out of the system area by a horizontal movement.

In this exemplary embodiment, arm 3 is composed of segments 3a and 3b which can be telescoped into each other, i.e. segment 3b can be slid into segment 3a in order to shorten or lengthen the arm 3.

In an alternative embodiment of the invention (not shown here), the arm 3 may only consist of segment 3a to which the forks 8 are mounted in this case.

In order to pick up a component, the arm 3 comprises the forks 8 at one side thereof, which are shown in an unfolded state here. Forks 8 consist of an upper portion 8b and a lower portion 8a which can be folded so as to be received in a recess 10 of the upper portion.

However, the component may as well be picked up without the forks, for example by being directly secured to the arm 3a.

One fork 8 is mounted to segment 3a and the other fork is mounted to segment 3b.

In this exemplary embodiment, forks 8 are furthermore displaceable horizontally along arm 3 or along the respective segment 3a, 3b, which is symbolized by arrow 14.

In this way it is possible to modify the spacing between the forks 8.

Furthermore, in this embodiment the upper portion 8b of the forks is mounted to arm 3 for rotation about a rotation axis 9 that extends perpendicularly to the top of arm 3.

In an alternative embodiment of the invention, which is not illustrated here, the upper portions cannot be rotated.

Thus, the forks 8 can be rotated so that their main extension direction coincides with the main extension direction of arm 3. The maintenance apparatus 1 can be compacted in this manner.

On the side of arm 3 facing away from forks 8, an accommodation means 11 is provided at the end of arm 3 or of segment 3b in this exemplary embodiment, which serves to lift heavy loads. In this exemplary embodiment, accommodation means 11 is in the form of a simple elbow.

It will be appreciated that both the forks 8 and the accommodation means 11 may comprise further locking means for securing the component during transportation, which are not illustrated here.

Also not illustrated is an optional locking means for locking the arm 3 in its respective pivotal position and segments 3a, 3b relative to each other.

In one embodiment, maintenance apparatus 1 is operated completely manually. The connecting unit 5 may be displaced along beam 2 by means of a crank drive, for example.

Preferably, a crank drive is also provided for driving the arm 3 in vertical direction, via arm seat 7.

The pivoting of arm 3 and extraction of segment 3b and unfolding of forks 8 may be effected manually.

In an alternative embodiment of the invention, the translational movements along arrows 12 and 13 and optionally also the extension of segment 3b are effected in motorized manner. In one embodiment of the invention, the pivoting movement of arm 3 is also effected in motorized manner.

Control may be effected via keys at a controller or via an interface and an external unit. Such control is only necessary if the axes are not controlled manually and no further actuators or sensors of the maintenance apparatus need to be controlled.

Optionally, maintenance apparatus 1 may additionally include sensors, in particular in order to permit to level out the height of a lifted component.

Figure 2:
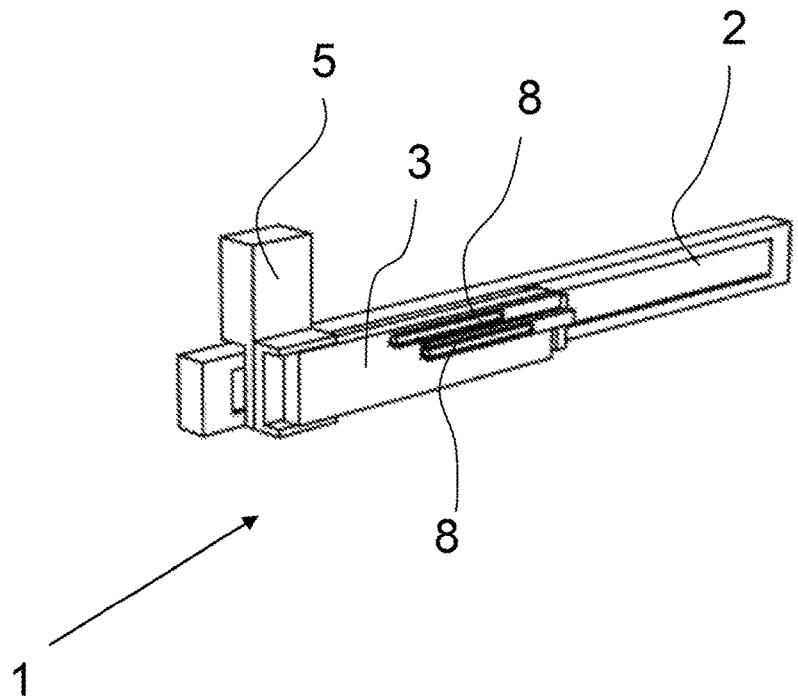
FIG. 2 shows the maintenance apparatus of FIG. 1 in its folded state.

FIG. 2 shows the maintenance apparatus 1 in its folded-up state.

It can be seen that the segments of arm 3 have been telescoped together and that the arm 3 now rests against beam 2.

Forks 8 are also folded up and rest against arm 3.

From this view it will be apparent that the maintenance apparatus 1 can be easily folded-up into a compact portable unit.

Only the connecting unit 5 is protruding laterally from the beam. Preferably, however, it has a significantly shorter length, preferably less than ⅓ of the length of beam 2. A connecting unit 5 laterally protruding beyond beam 2 is required for vertically lifting the component that is to be displaced, if the maintenance apparatus has vertical driving means.

Figure 3:
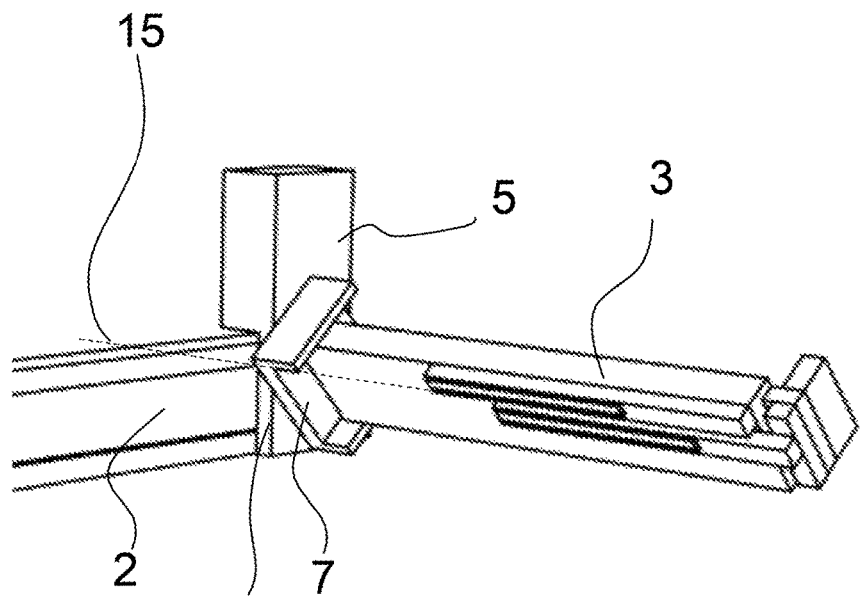
FIG. 3 is a view of a detail.

FIG. 3 is a detailed view of the arm 3 illustrated in FIG. 2, which is mounted to beam 2 via connecting unit 5.

In this view it can be seen that arm seat 7 is rotatable relative to beam seat 6.

Rotation axis 15 extends in the horizontal plane along the main extension direction of arm 3. By virtue of the fact that the arm 3 is mounted for rotation, it can be rotated through 90° relative to the position shown in FIG. 1, and can then be pivoted so as to extend upwards or downwards, so that the main extension direction of the arm 3 will then be aligned vertically.

With reference to FIGS. 4 to 8, the unfolding of a maintenance apparatus 1 will be explained.

Figure 4:
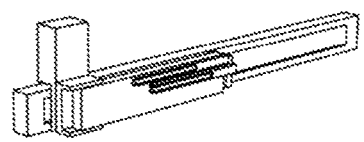
FIGS. 4 to 8 are intended to illustrate in more detail the deployment of a maintenance apparatus.

FIG. 4 shows the maintenance apparatus 1 in its folded-up state, like FIG. 2.

Figure 5:
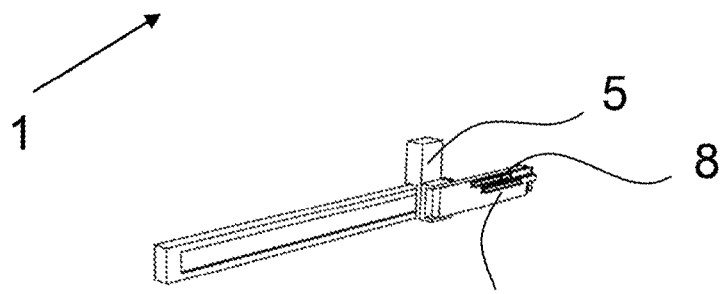

In FIG. 5, the connecting unit 5 of maintenance apparatus 1 has now been moved from the left end of arm 3 to the right end of arm 3. The user now has good access to arm 3 and to forks 8 provided in this exemplary embodiment and arranged on the arm.

Figure 6:
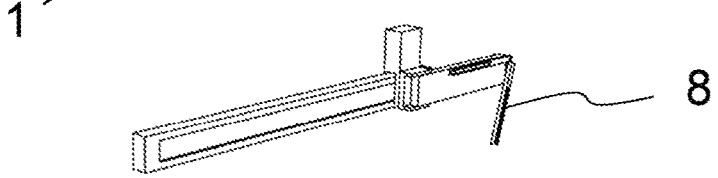
Figure 7:
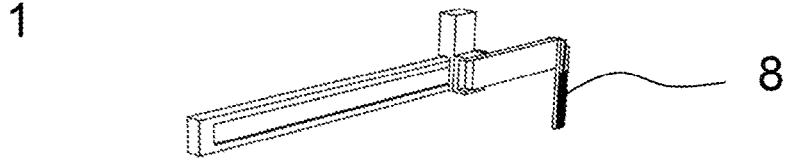

As shown in FIGS. 6 and 7, the forks 8 can now be pivoted through 90° so that the main extension direction of the forks 8 still folded together is vertical.

Figure 8:
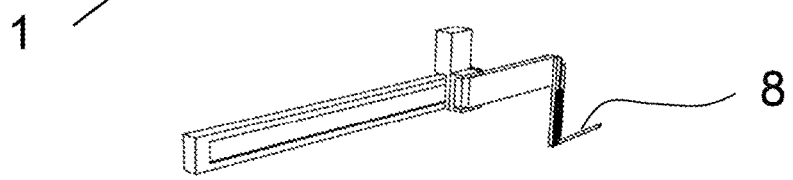

Subsequently, as illustrated in FIG. 8, the lower portion 8a of the forks (which is foldable in this exemplary embodiment) can be folded out, so that the forks 8 form an L-shaped configuration.

Figure 9:
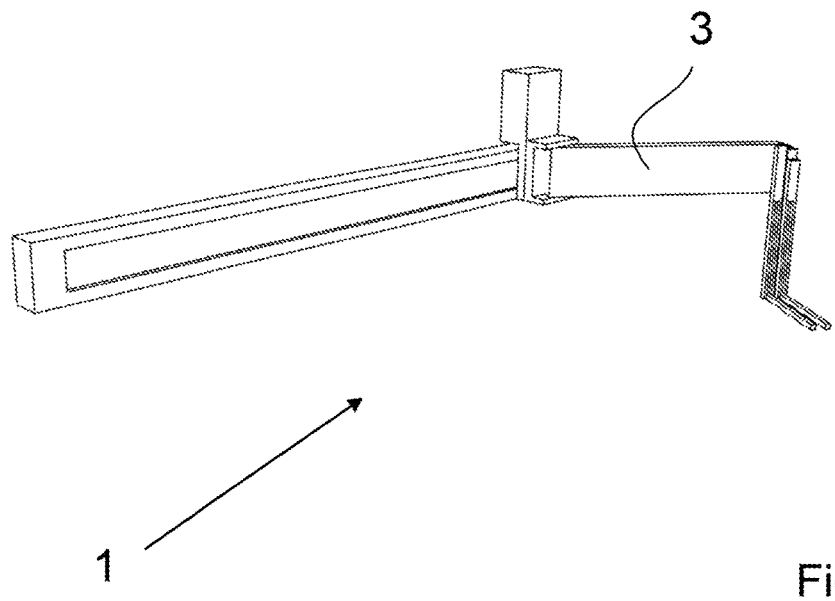
FIGS. 9 to 15 are further detailed views of the maintenance apparatus, illustrating the components of the maintenance apparatus in different motion states.

FIG. 9 shows how the arm 3 is now pivoted horizontally, for example in order to be positioned above a system area in which a component to be lifted is located.

Figure 10:
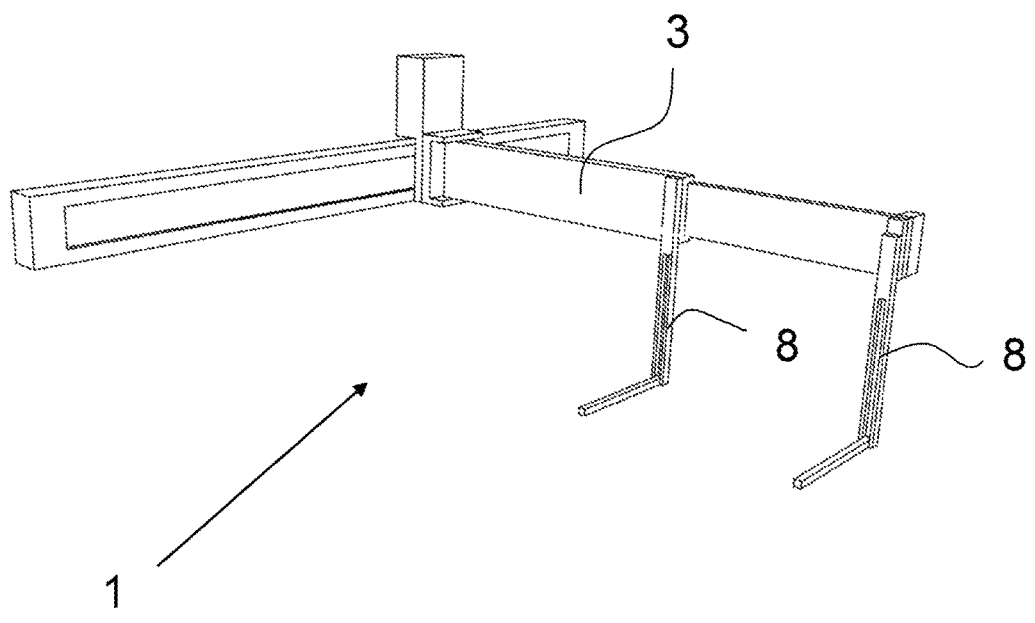

As shown in FIG. 10, the arm 3 (of extendable configuration in this exemplary embodiment) can then be telescoped out, so that the forks 8 are now spaced from one another.

Figure 11:
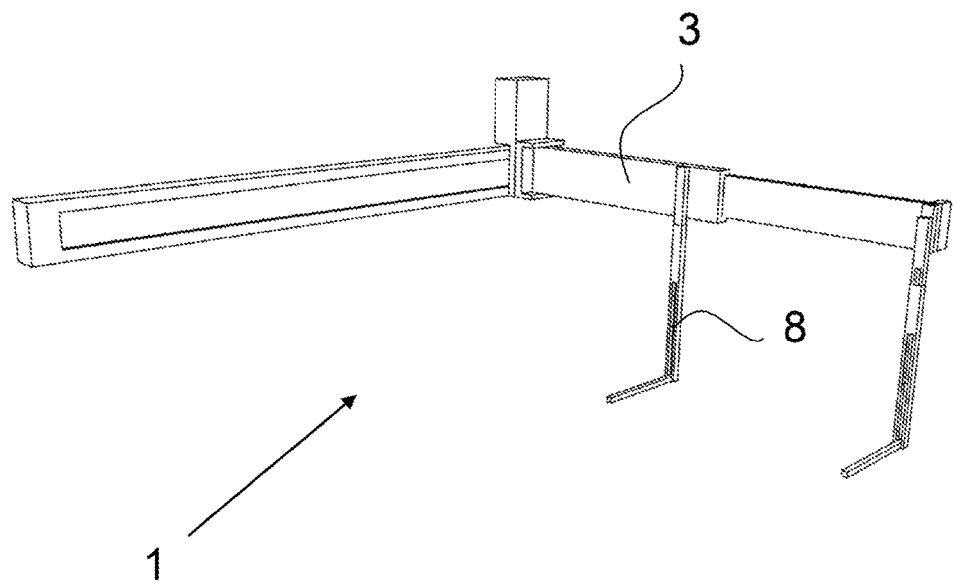

As can be seen in FIG. 11, at least one fork 8 is displaceable horizontally along arm 3 in this exemplary embodiment.

Figure 12:
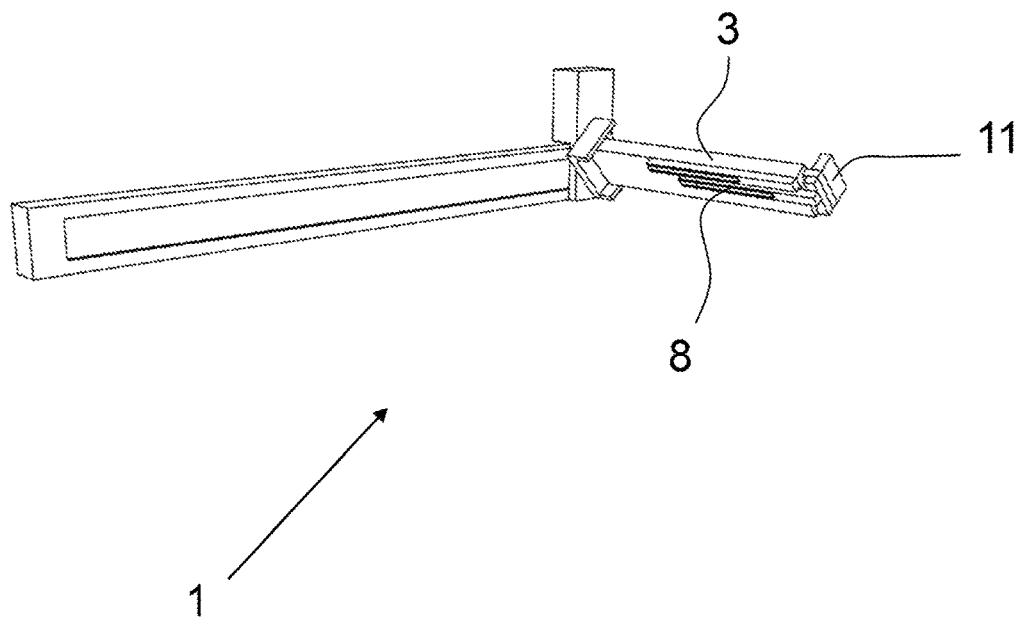

FIG. 12 shows a further detailed view in which the arm 3 is being rotated in this exemplary embodiment, for example in order to arrange forks 8 and seat 11 so as to face the respective opposite direction in space.

Figure 13:
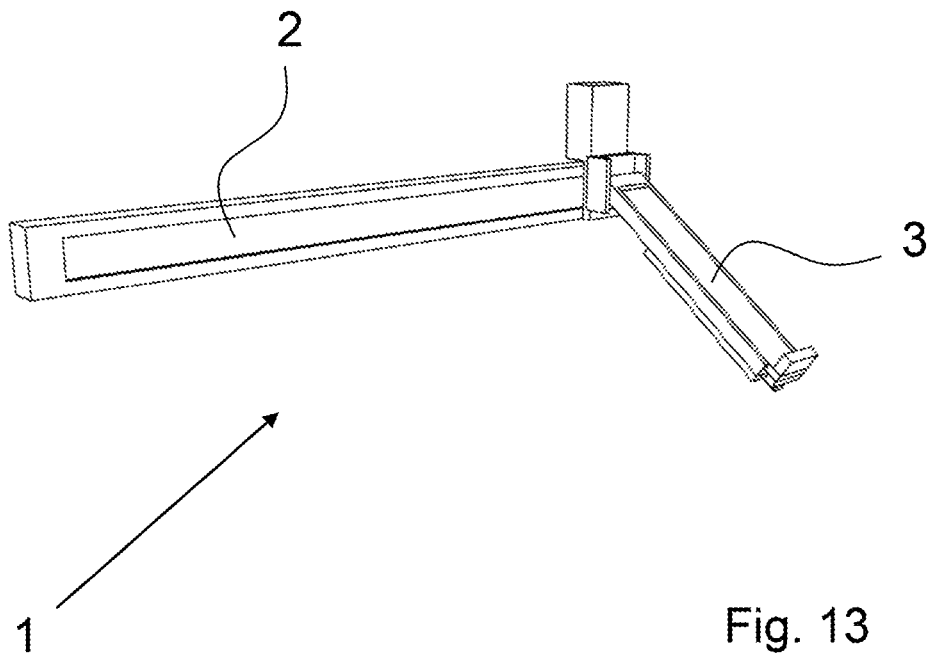

Furthermore, as shown in FIG. 13, the arm 3 may as well be rotated so as to be no longer pivotable horizontally relative to beam 2, but can be pivoted upwards or downwards.

Figure 14:
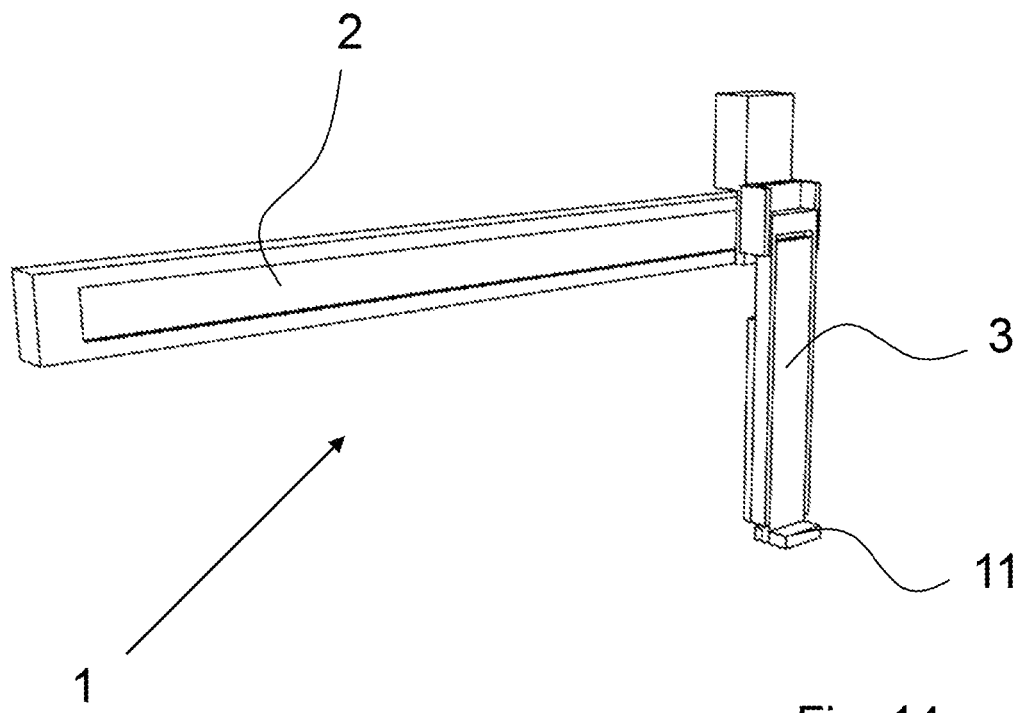

FIG. 14 illustrates the arm 3 in a position completely pivoted downwards. In this position, the arm 3 is not adapted to be laterally pivoted into a system area. Rather, the arm is horizontally displaced via the connecting unit. In this position, a heavy load can be laterally engaged and lifted using accommodation means 11.

In this manner, considerably heavier loads can be moved than in the laterally pivoted position, since the arm 3 now does not form a long lever relative to the beam 2.

Figure 15:
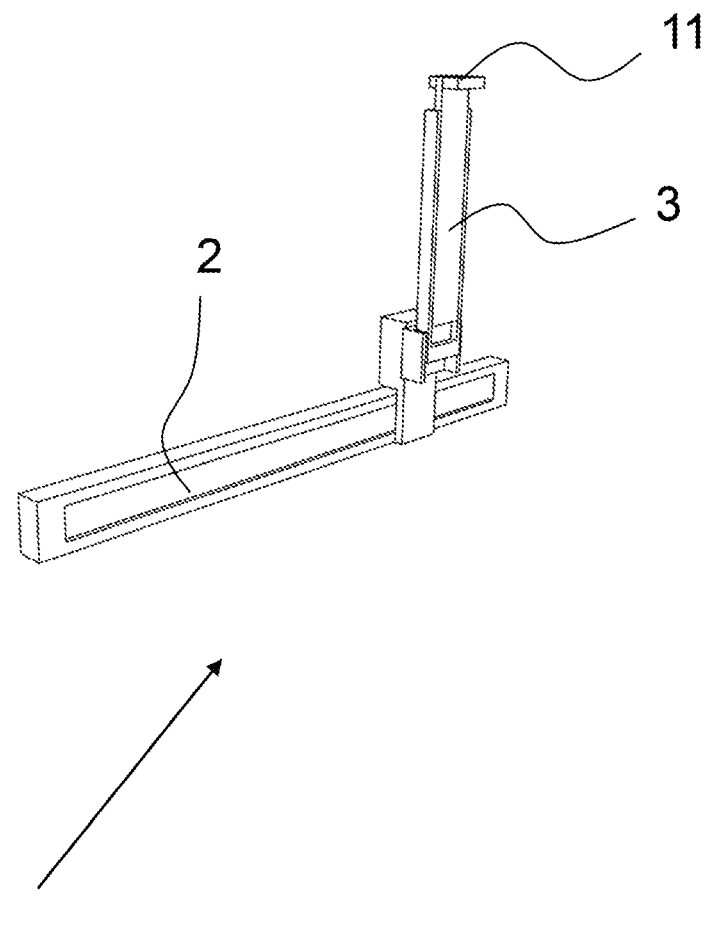

As shown in FIG. 15, the arm 3 may even be pivoted upwards, so that accommodation means 11 is now located above the beam 2.

Figure 16:
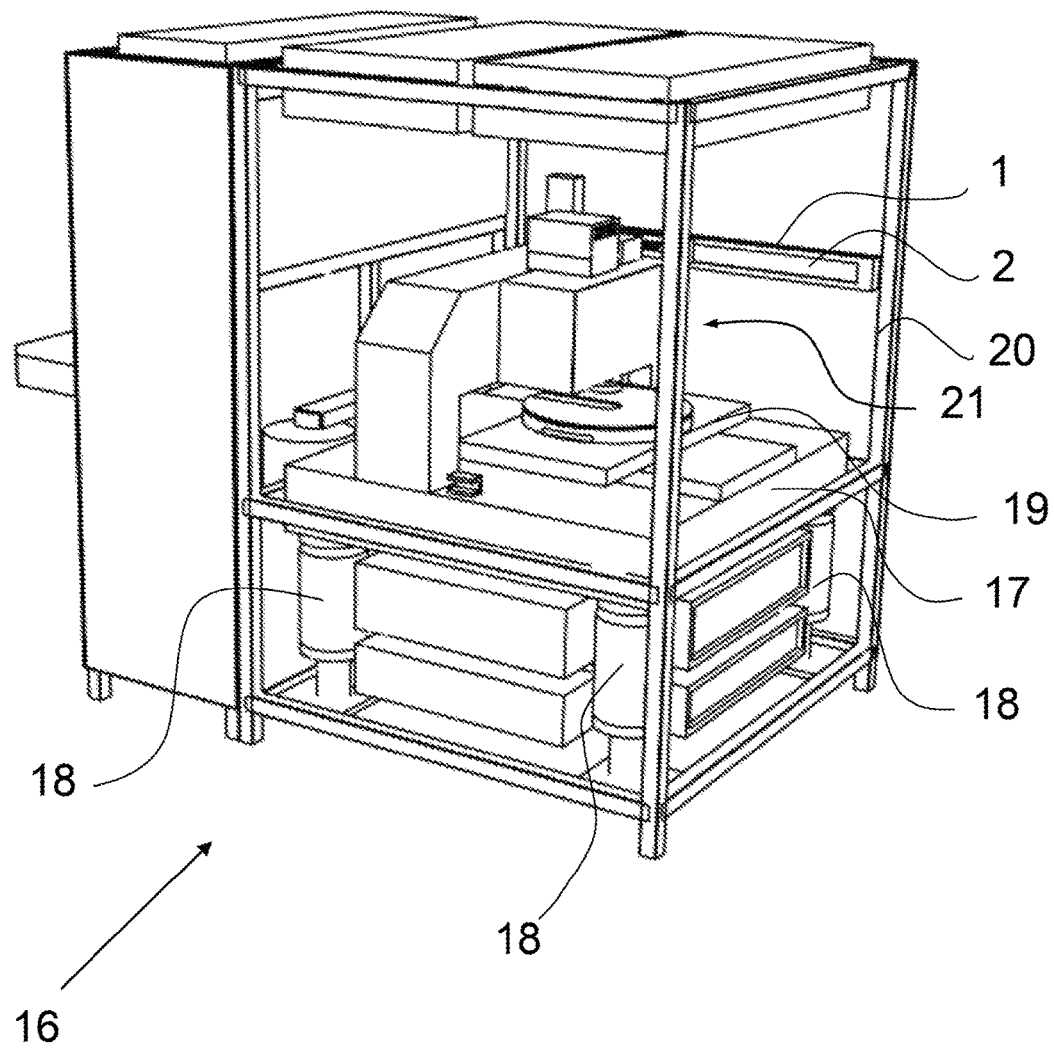
FIGS. 16 to 24 show various application examples of a maintenance apparatus in a system for processing semiconductor devices, FIGS. 22 and 24 being views of details of the maintenance apparatus.

FIG. 16 shows a perspective view of a system 16 for processing semiconductor devices.

System 16 comprises a table 17 which is mounted on vibration isolators 18.

On table 17 which preferably is designed as a granite slab, a movable stage 19 is mounted which is a constituent part of the system 16 for processing semiconductor devices, in the present example a system 16 including a metrology device 21.

System 16 is preferably employed in a clean room.

System 16 furthermore comprises a frame 20. Inside of frame 20 the sensor of the metrology device 21 is arranged.

As can be seen in this view, the beam 2 of the maintenance apparatus 1 illustrated before is mounted to frame 20.

Figure 17:
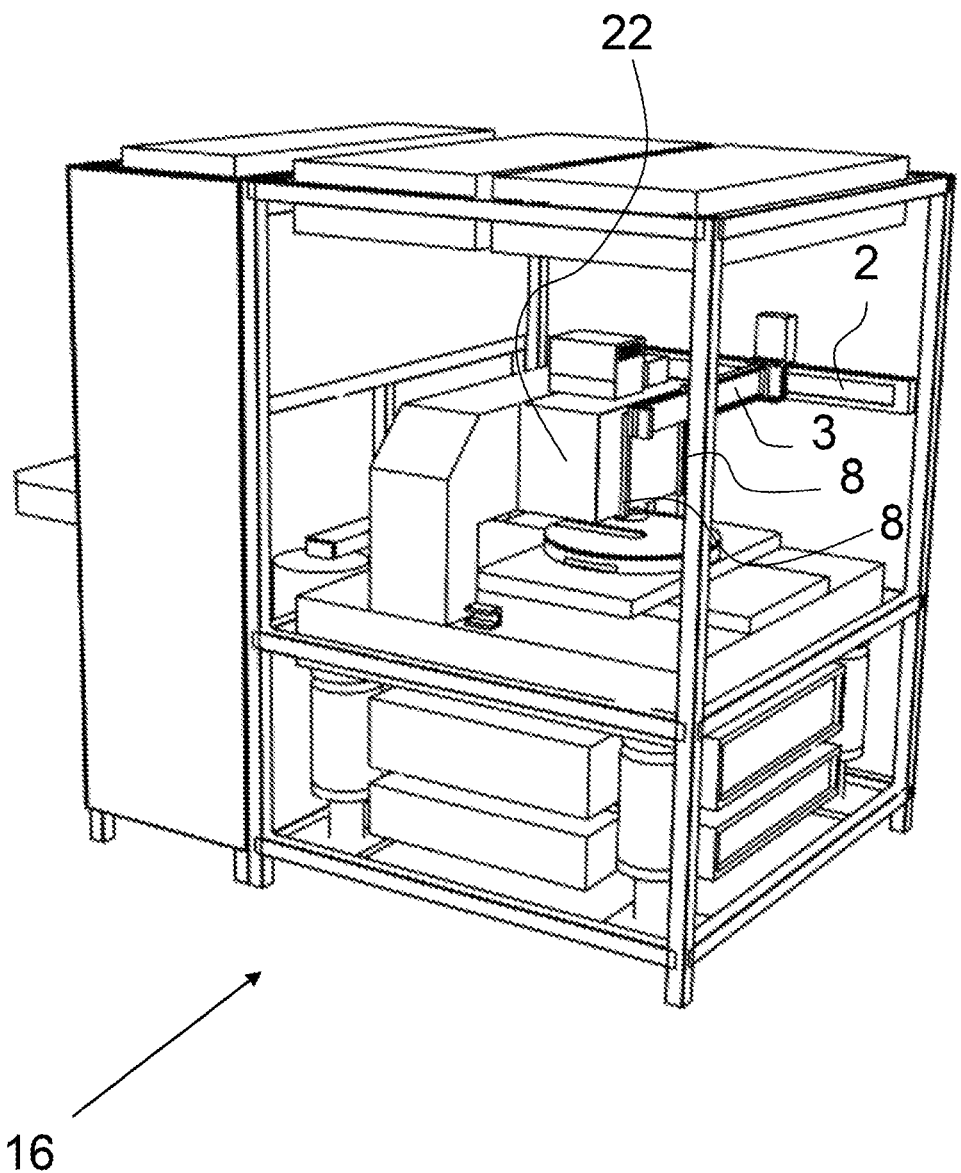

As illustrated in FIG. 17, the arm 3 can be horizontally pivoted away from beam 2, and in this exemplary embodiment a sensor 22, e.g. an optical sensor, is gripped from below by forks 8. The component, in this exemplary embodiment the optical sensor 22, can be secured against slipping (not shown) on the forks 8 by optional vacuum suction means or by mechanical locking means or by magnetic locking means.

Figure 18:
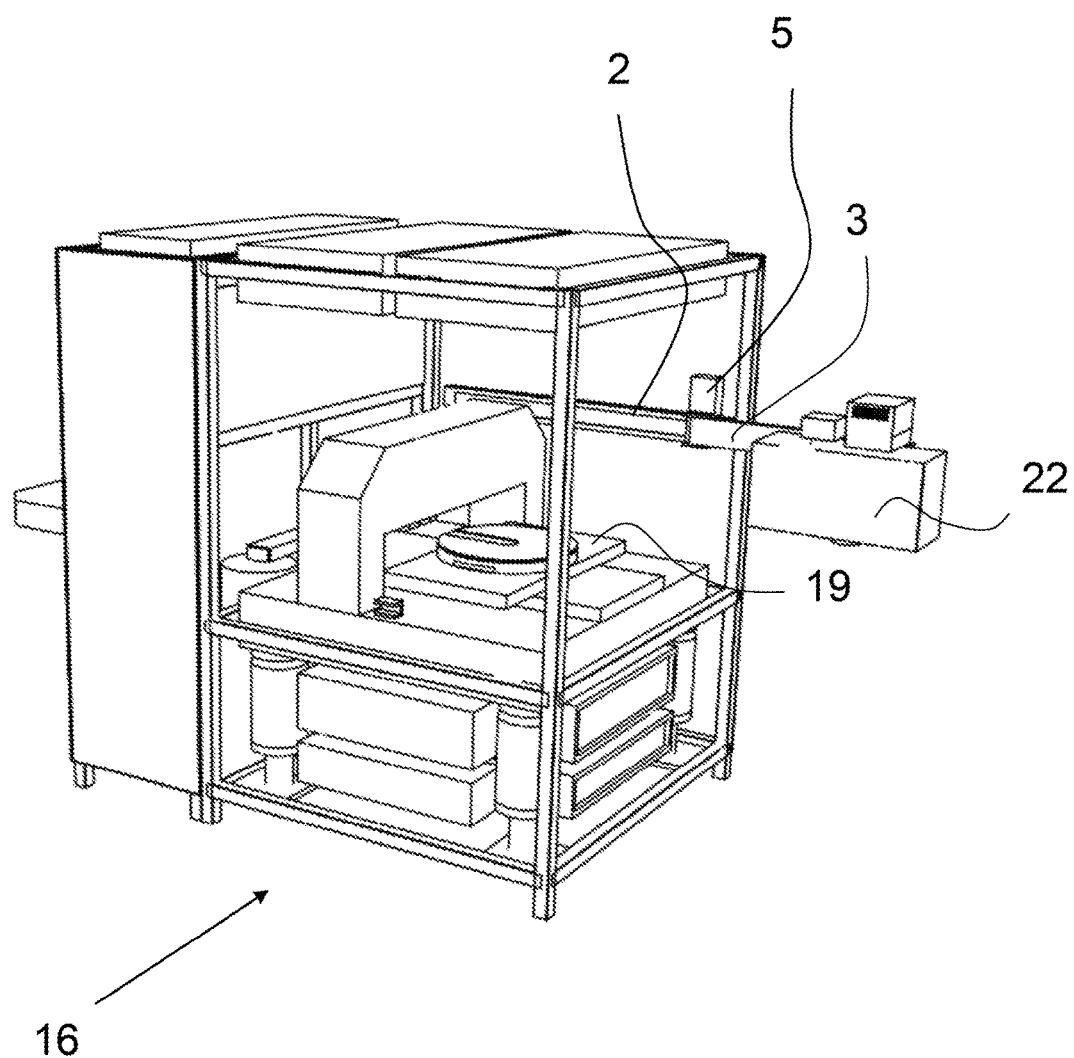

As illustrated in FIG. 18, the component, in this exemplary embodiment the optical sensor 22, can be easily moved out of the system area by a pivoting movement of arm 3, and can be removed or have maintenance work done thereon. For this purpose, the connecting unit 5 was moved horizontally along beam 2.

Stage 19, optical sensor 22, or other components of the metrology system are now accessible for maintenance work.

Figure 19:
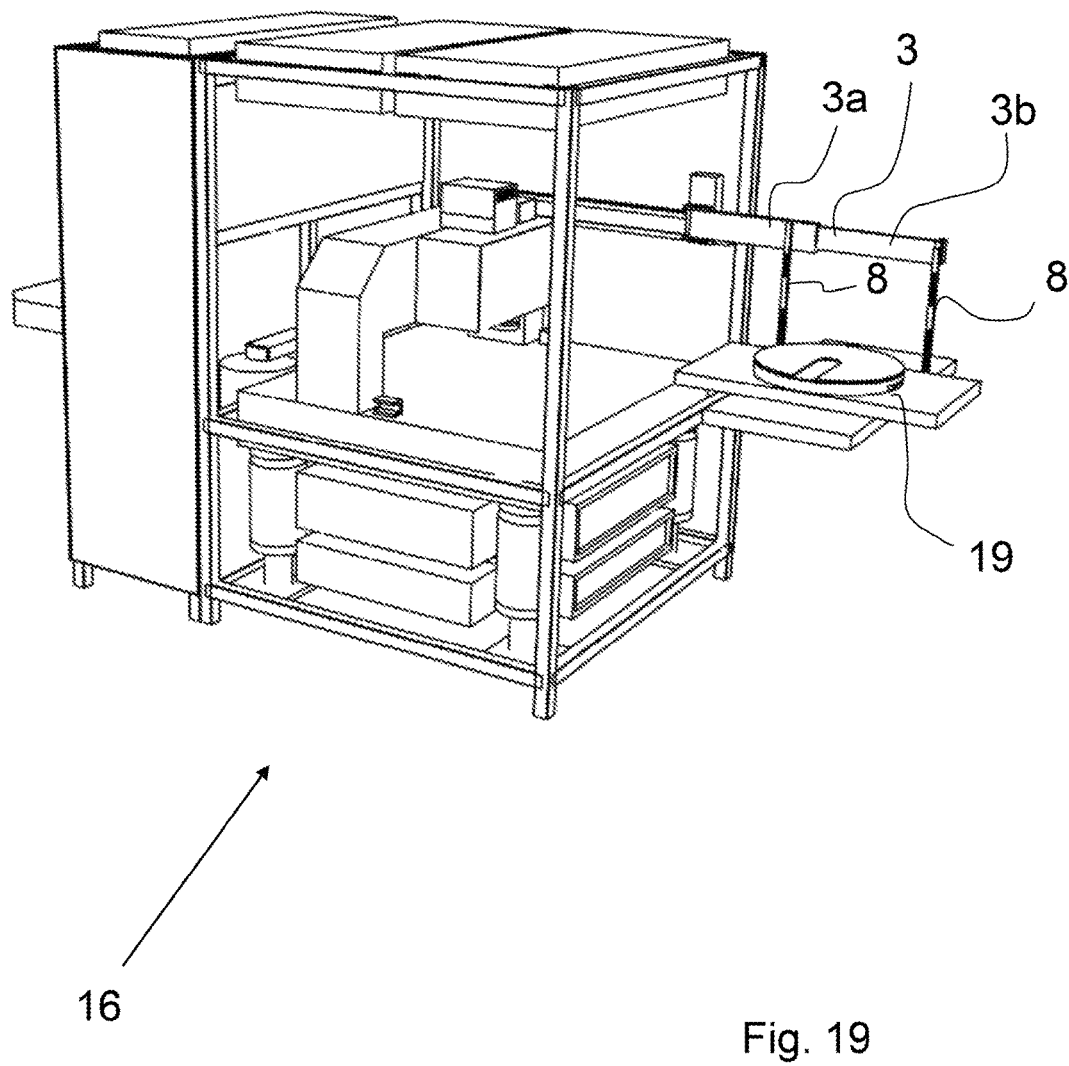
Figure 20:
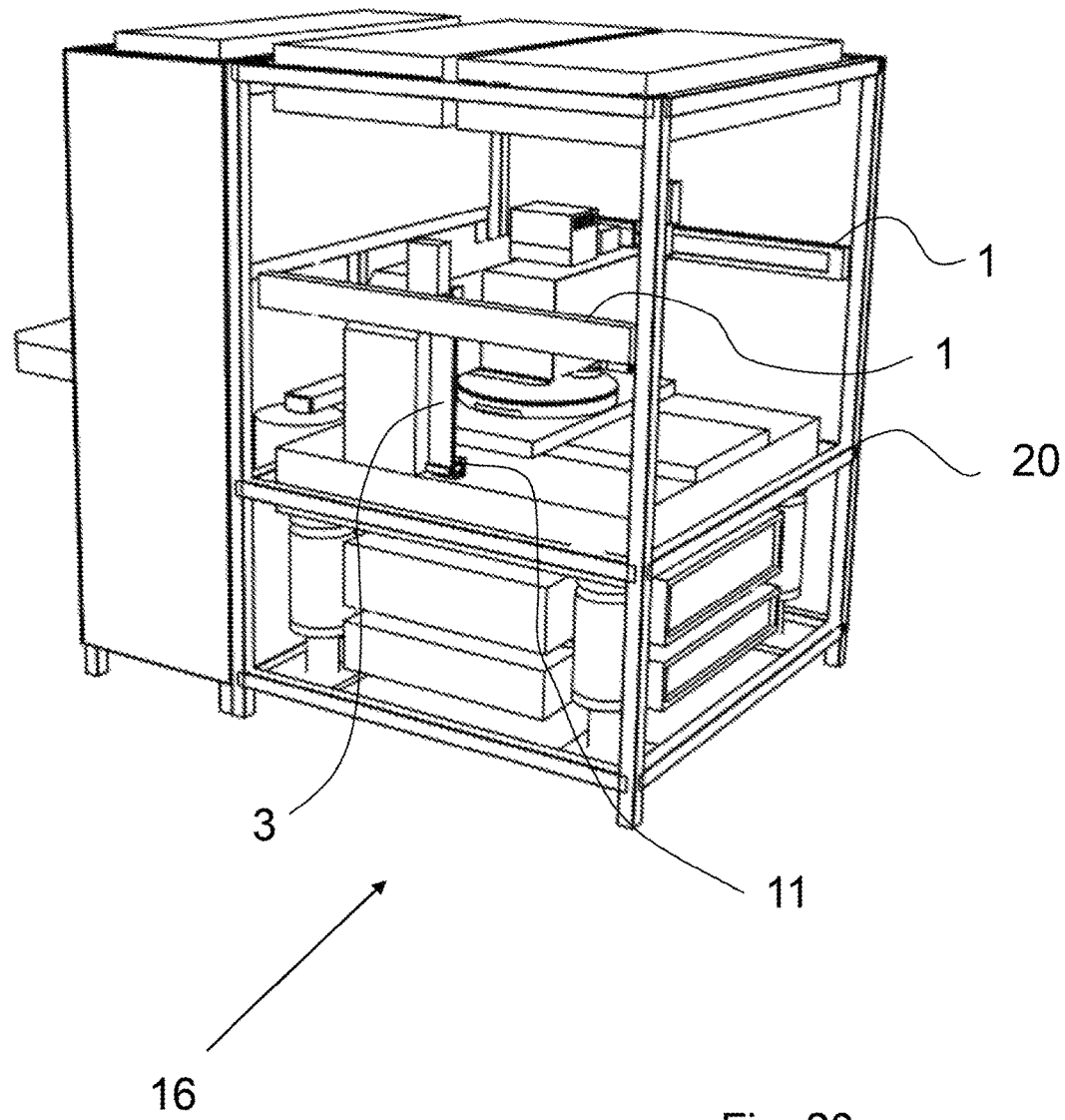

As illustrated in FIG. 19, stage 19 may also be pivoted out of the system area by forks 8.

For this purpose, the arm 3 is extended in this exemplary embodiment by partially extracting segment 3*b* from segment 3*a*. Forks 8 now have a wider spacing compared to the condition illustrated in FIG. 17.

Referring to FIGS. 20 to 24, the displacement of heavier components will now be explained.

FIG. 20 again shows a system 16 for processing semiconductor devices.

In contrast to the preceding drawings, two maintenance apparatuses 1 are now mounted to the frame 20 of system 16, which are arranged diametrically opposite to each other.

The arms 3 of the respective maintenance apparatuses 1 are not horizontally pivoted into the system area, rather they are rotated through 90° into a position in which the arms 3 can be pivoted downwards so that the elbow-shaped accommodation means 11 defines the lower end of arm 3.

In other exemplary embodiments, the pivotable arms may as well be replaced by other in particular non-pivotable components which connect the component to be moved (in this exemplary embodiment the table 17) to the maintenance apparatus.

Figure 21:
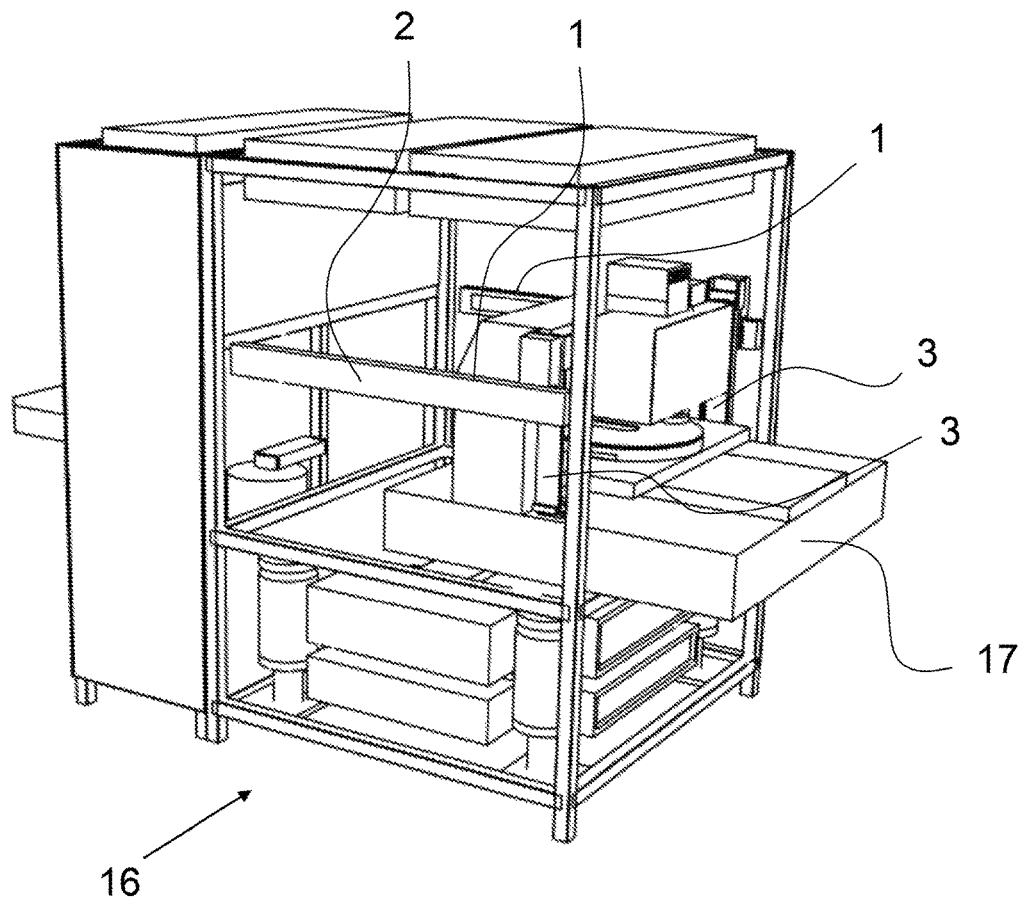

As illustrated in FIG. 21, the entire table 17 can be partially moved out of the system area by means of arms 3, by being lifted by arms 3 and accommodation means 11 and displacing the arms along beams 2.

For this purpose, the maintenance apparatuses 1 may include synchronized horizontal and/or vertical drives (not shown). In the case of motorized horizontal and/or vertical drives, this synchronization may be achieved via the drive controller, and in particular in the case of manual horizontal and/or horizontal drives via a mechanical link, for example a connecting shaft coupled to the movement axes.

Figure 22:
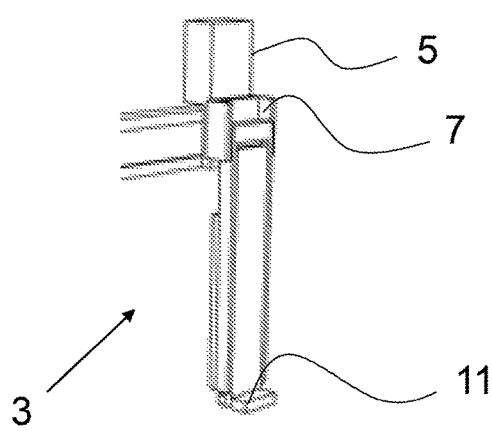

FIG. 22 is a detailed view of the downwardly pivoted arm 3 which can be driven upwards along connecting unit 5, through arm seat 7, for lifting the table.

Figure 23:
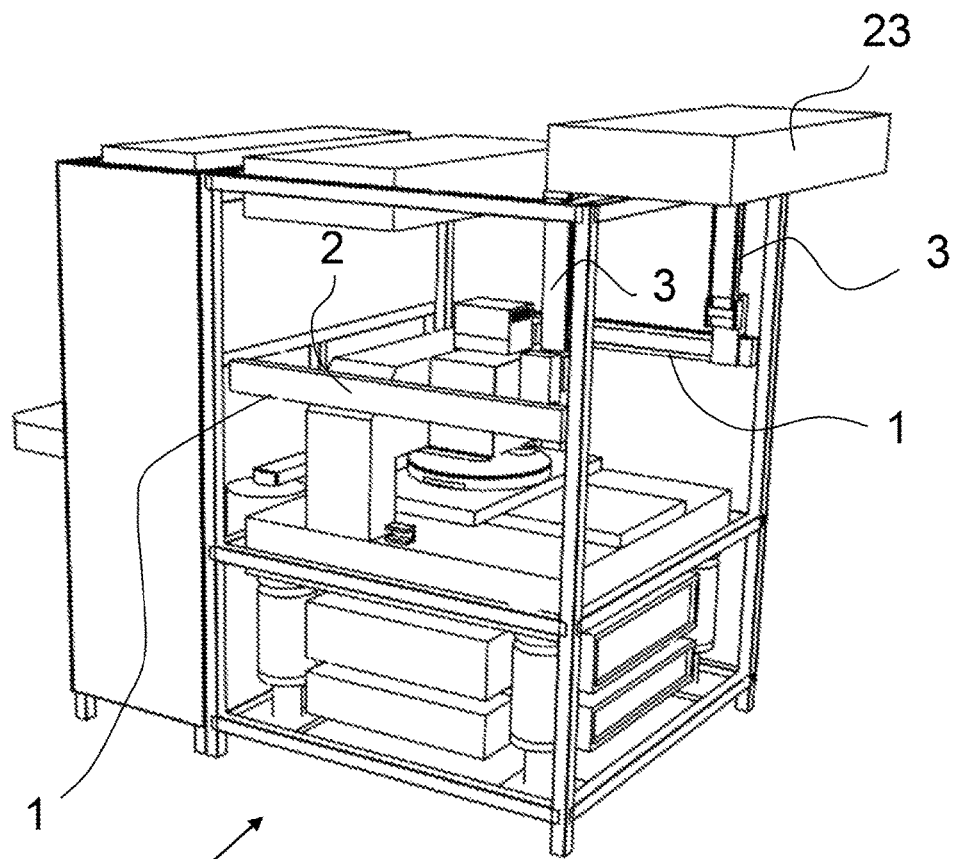
Figure 24:
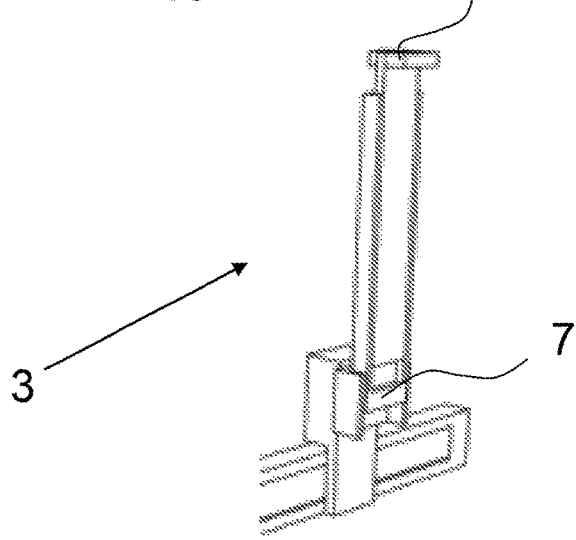

FIG. 23 shows that it is also possible to move heavy loads arranged above the maintenance apparatus 1 using the two maintenance apparatuses 1. For this purpose, the arms 3 are pivoted vertically upwards and are thus able to lift further components, in particular the filter module 23 of system 16 illustrated here, and to displace them laterally along beams 2.

FIG. 24 again shows a detailed view of arm 3.

It can be seen that the arm 3 is pivoted vertically upwards so that the accommodation means 11 is located at an upper end of the arm 3. The load can again be lifted by moving the arm seat 7.

Referring to FIGS. 25 to 28, the installation of a maintenance apparatus according to the invention will now be explained in more detail.

Figure 25:
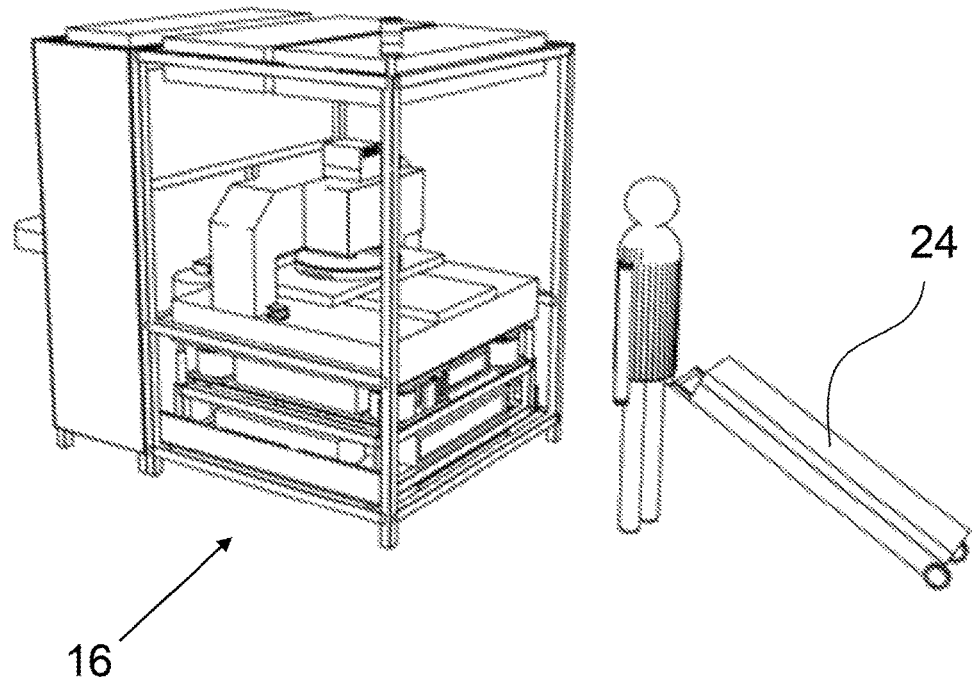
FIGS. 25 to 28 are intended to illustrate in more detail the installation of a maintenance apparatus according to the invention. This embodiment of a maintenance apparatus according to the invention is only temporarily mounted to the system.

As illustrated in FIG. 25, in its folded-up state the maintenance apparatus may be accommodated in a trolley case 24 which can be brought to the system by the user.

Figure 26:
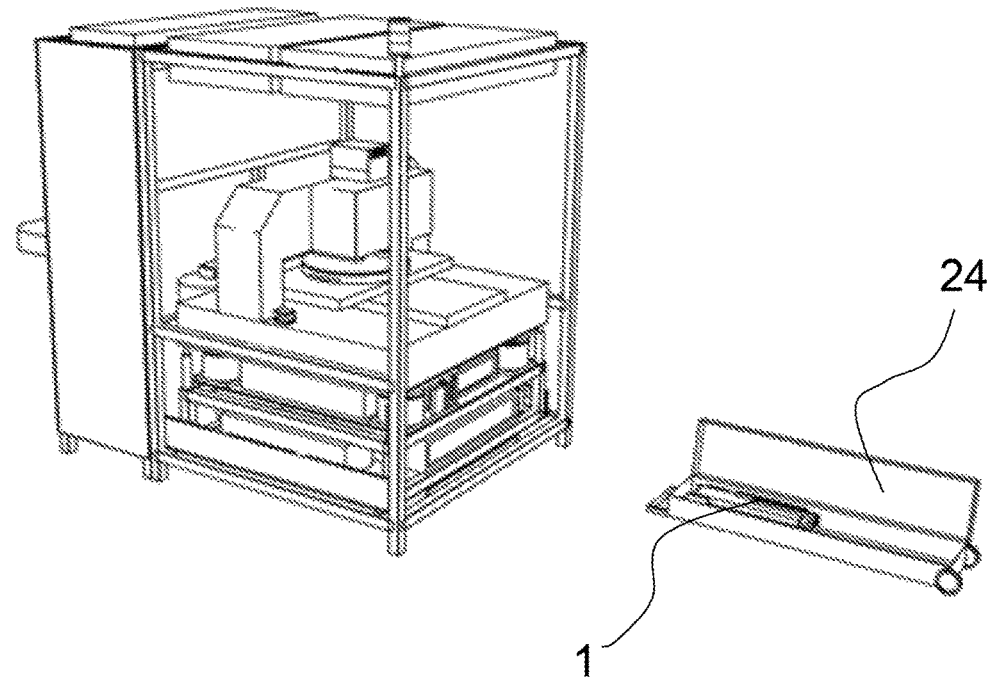

FIG. 26 shows the opened trolley case in which maintenance apparatus 1 is accommodated in its folded-up state.

Figure 27:
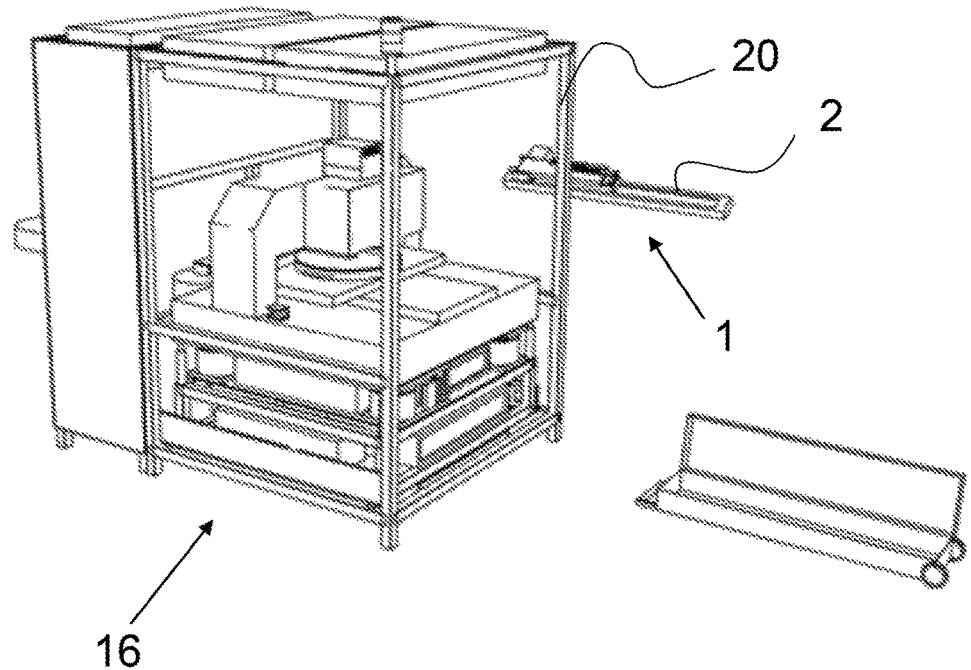
Figure 28:
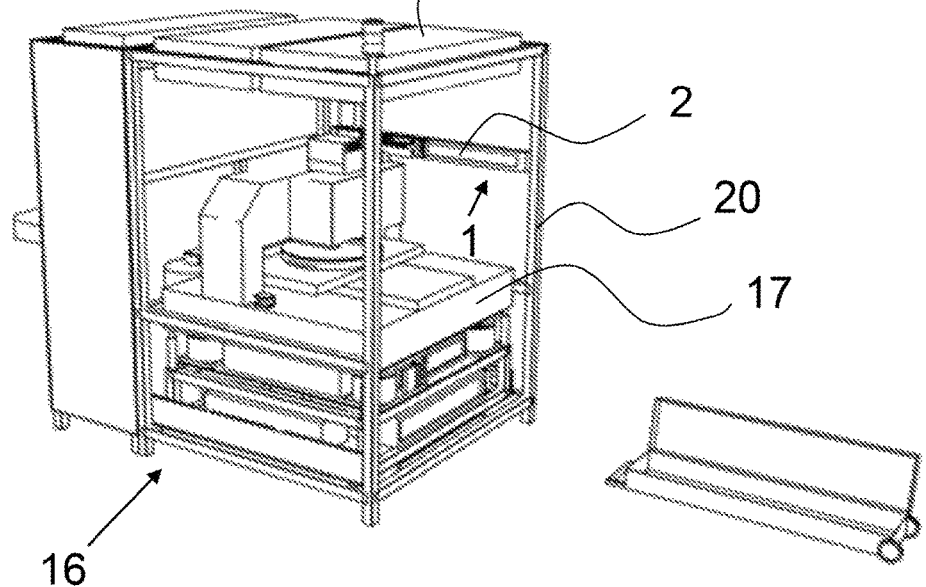

Then, as illustrated in FIGS. 27 and 28, the beam 2 of maintenance apparatus 1 can be mounted to the frame 20 of system 16. Maintenance apparatus 1 is arranged between an upper system component 23 of the system and table 17 of system 16.

An optionally provided controller (not shown) of maintenance apparatus 1 may also be accommodated in trolley case 24. According to an alternative embodiment, the controller is a constituent part of the system itself and therefore does not have to be transported to the system. Installation may be accomplished by a screw connection on frame 20, for example.

Preferably, however, a quick-release clamping mechanism is employed, as will be described in more detail with reference to FIGS. 30 and 31.

Figure 29:
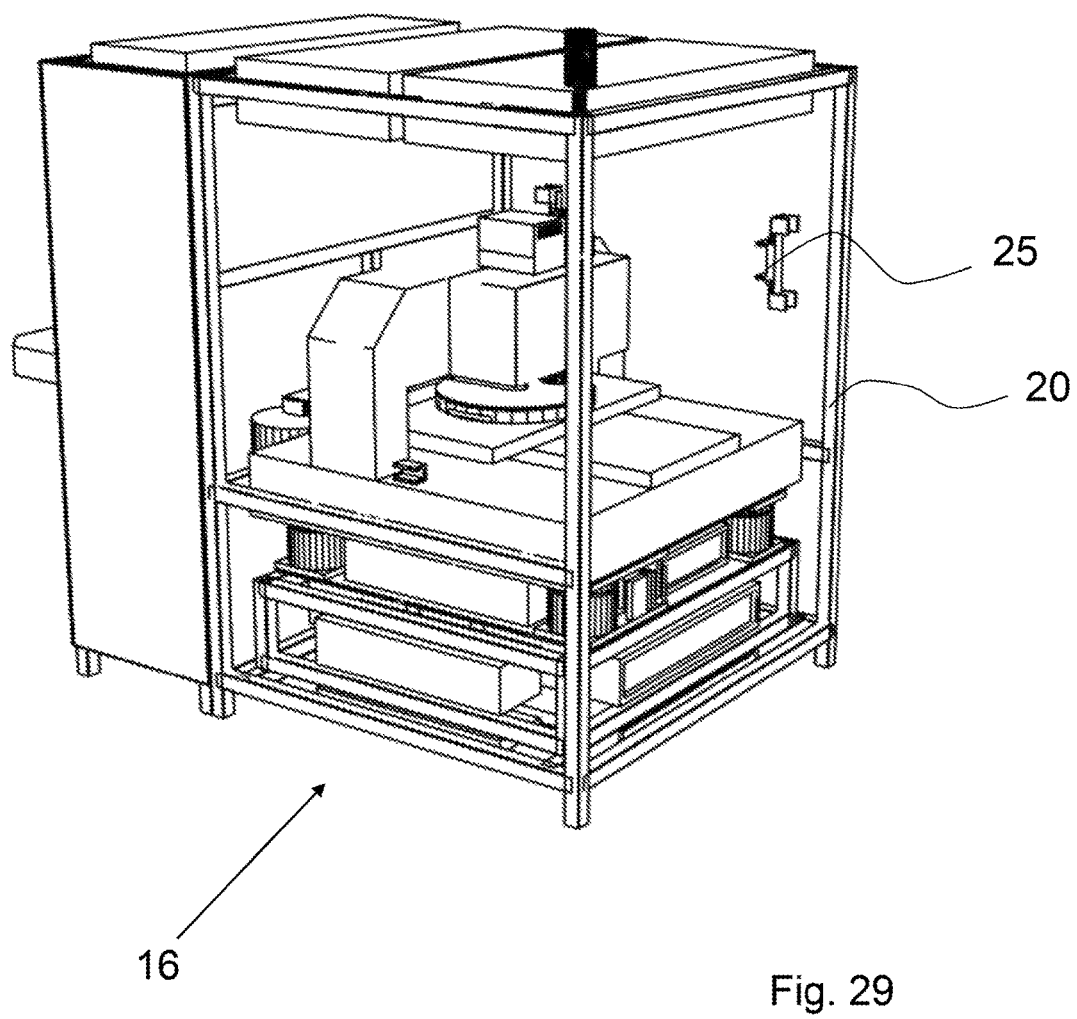
FIGS. 29 to 31 illustrate the installation of a maintenance apparatus using a quick-release clamping mechanism.

As illustrated in FIG. 29, an adapter 25 may be used for mounting the maintenance apparatus.

It may be secured to the frame 20 in a form-fitting and/or force-locking manner, for example.

According to one embodiment, several different adapters are enclosed with the maintenance tool in order to enable it to be installed on differently designed systems. In particular adapters of different widths may be provided, which are adapted to the respective system profile of the frame 20 of different systems 16.

Figure 30:
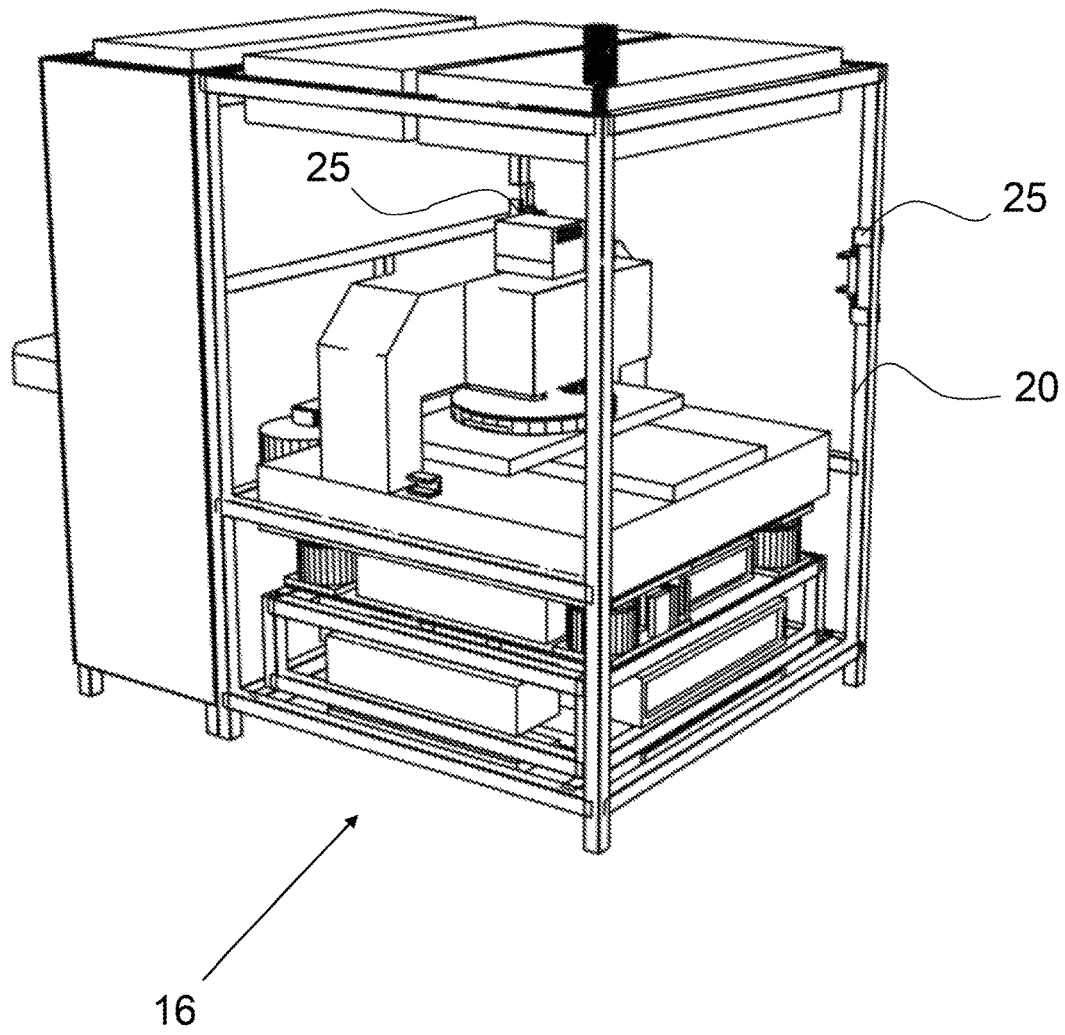
Figure 31:
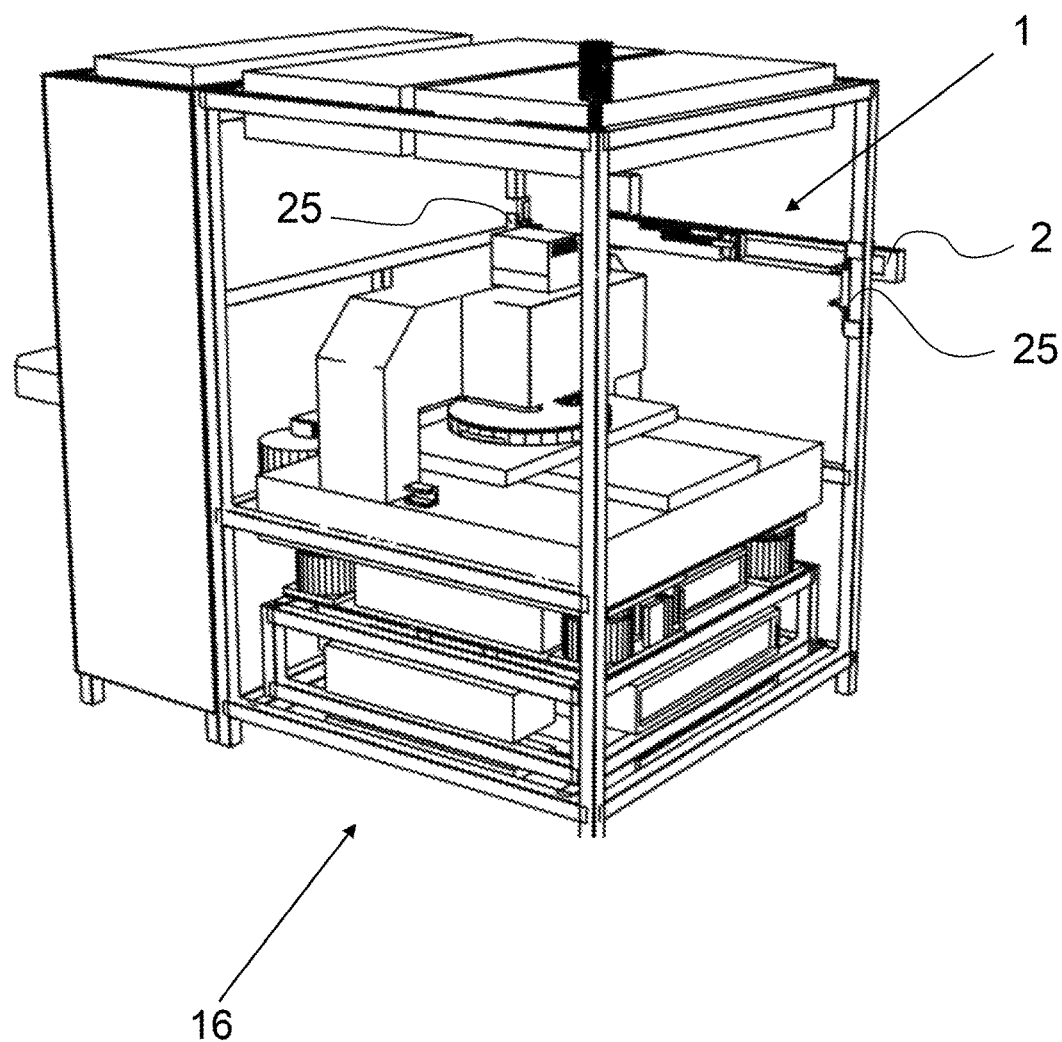

As illustrated in FIG. 30, the adapter 25 is fixed to the frame 20. The adapter may in particular have a clip-like configuration and can be connected to the frame in a force-locking and/or form-fitting manner.

Beam 2 of maintenance apparatus 1 can then be mounted to the adapters 25, preferably by means of a quick-release clamping mechanism.

Figure 32:
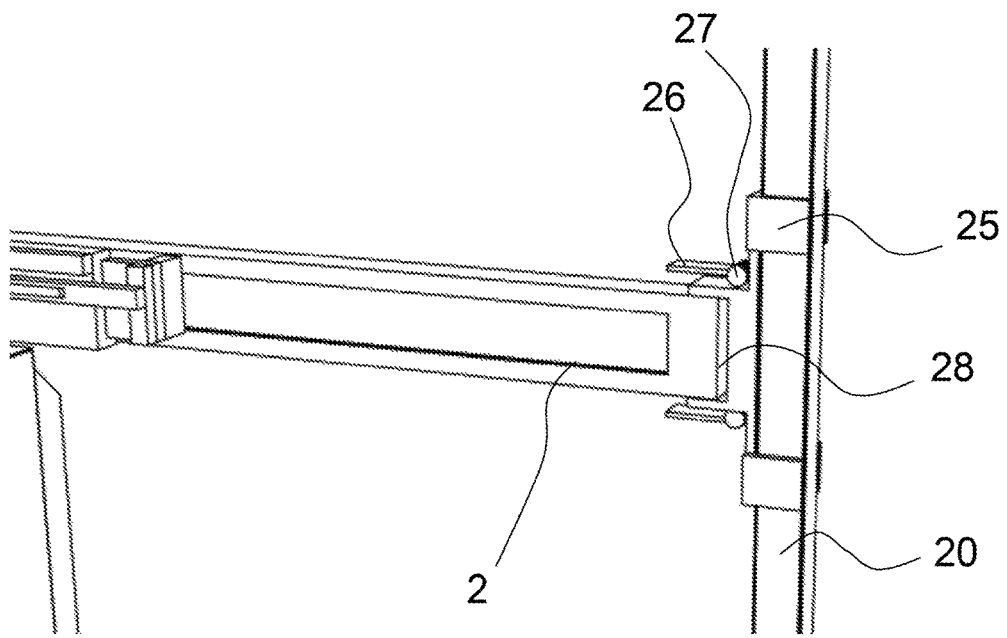
FIGS. 32 and 33 are views of details of the quick-release clamping mechanism.
Figure 33:
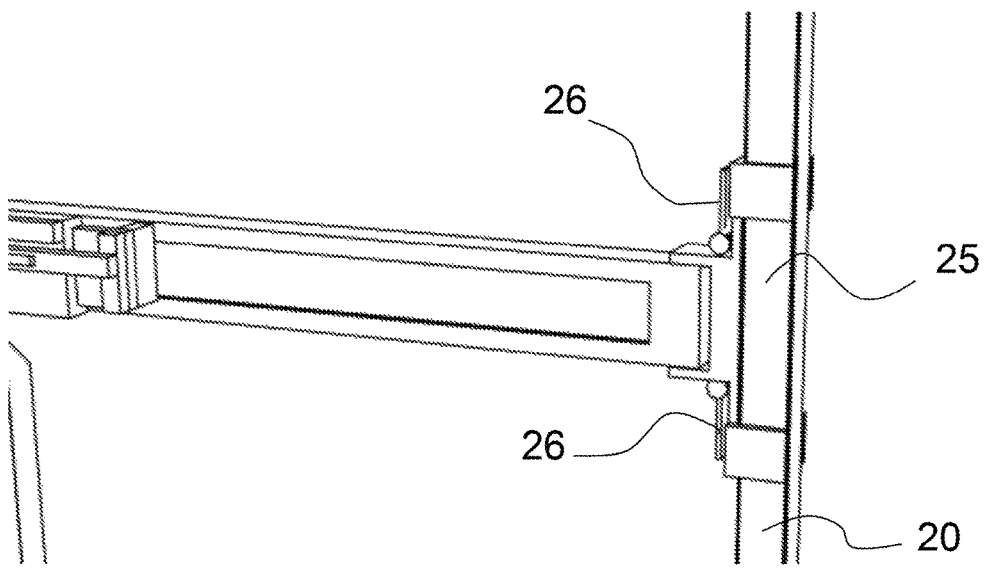

This is shown in detail in FIGS. 32 and 33.

In this exemplary embodiment, the quick-release clamping mechanism of adapter 25 includes respective levers 26 with a cam 27. The beam 2 is arranged in a recess 28 of the adapter.

As shown in FIG. 33, the quick-release clamping mechanism of adapter 25 is locked by pivoting the levers 26.

It will be understood, however, that differently configured form-fitting or force-locking elements may be used as well.

Figure 34:
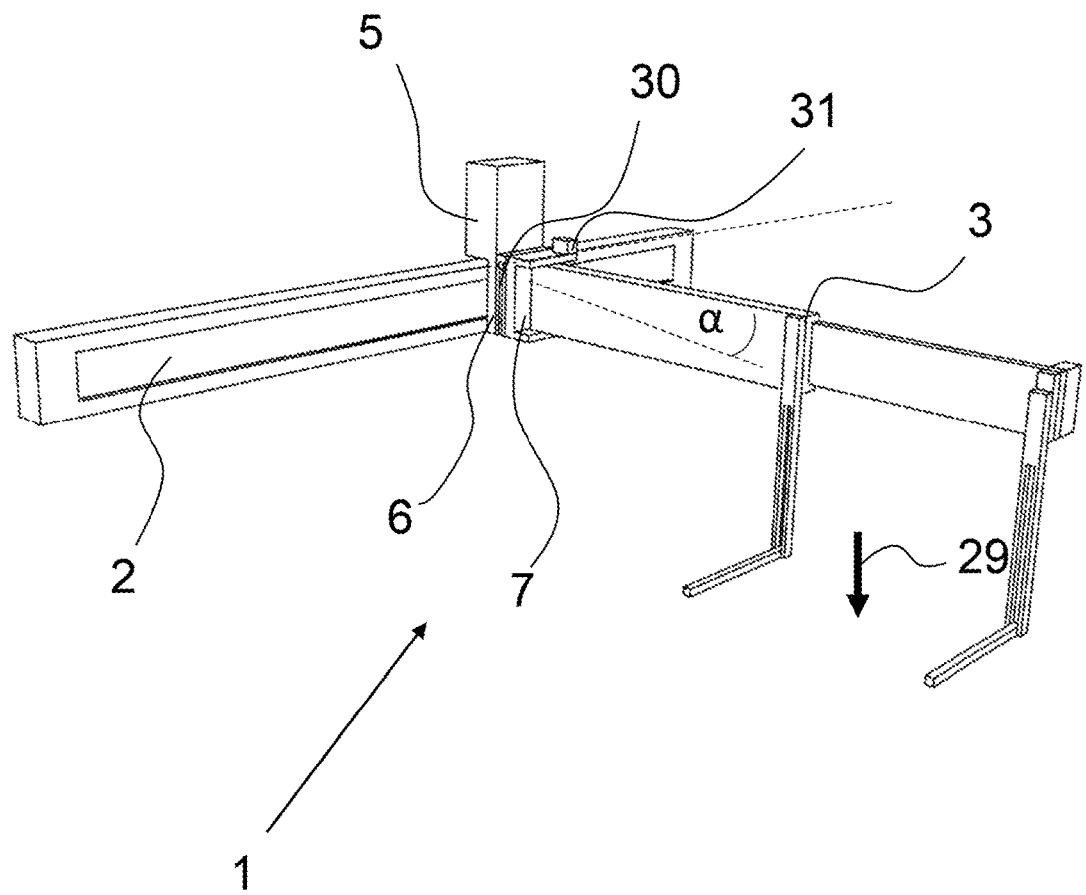
FIG. 34 shows a maintenance apparatus which has a hinge for leveling out the angle of the arm of the maintenance apparatus.

FIG. 34 shows a further exemplary embodiment of a maintenance apparatus. In this embodiment, the connecting unit 5 comprises a compensation joint 30 arranged between arm seat 7 and beam seat 6.

As symbolized by arrow 29, an accommodated load exerts a force on arm 3, which causes the arm 3 to be deflected by an angle α, due to the long lever and the non-infinite stiffness of the system.

This causes an alteration of the height and in particular angular position of the load.

Such alteration in angular position is detected by a sensor 31 and can be compensated through compensation joint 30 using an actuator (not shown) by pivoting the arm 3 upwards via the compensation joint 30.

This is preferably automated.

A motorized actuator can be used as the actuator. In particular the use of a piezo actuator, an electric motor, or pneumatic means is suggested. A manual embodiment is also possible.

Figure 35:
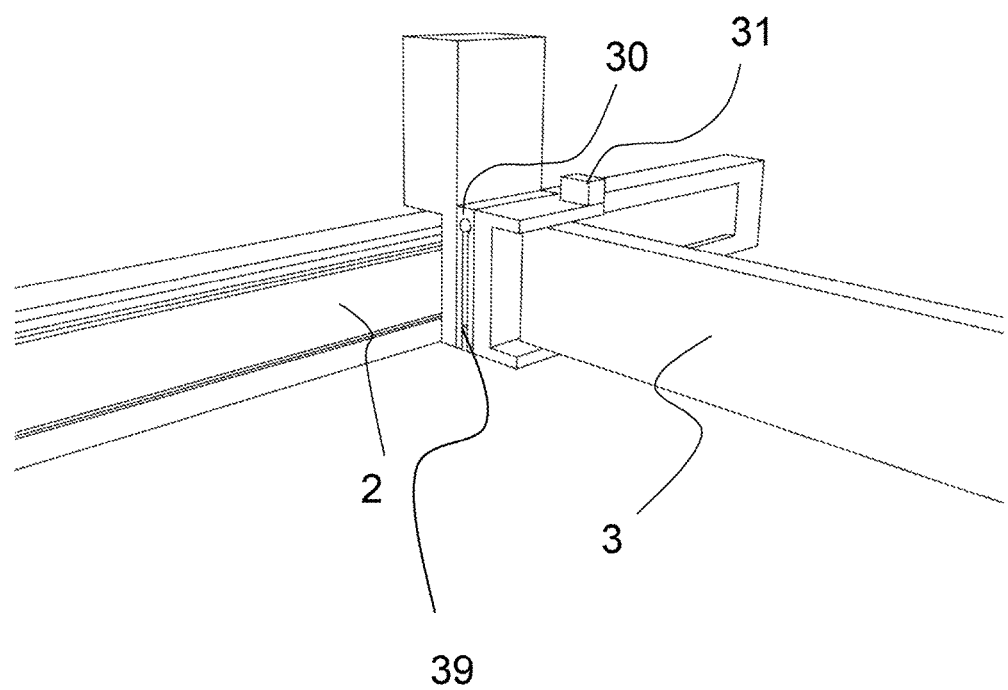
FIG. 35 is a view of a detail of the maintenance apparatus shown in FIG. 34.

FIG. 35 is a detailed view of the compensation joint 30, which in this exemplary embodiment is embodied as a flexure bearing.

The actuator 39 is located between the two halves of this flexure bearing.

Figure 36:
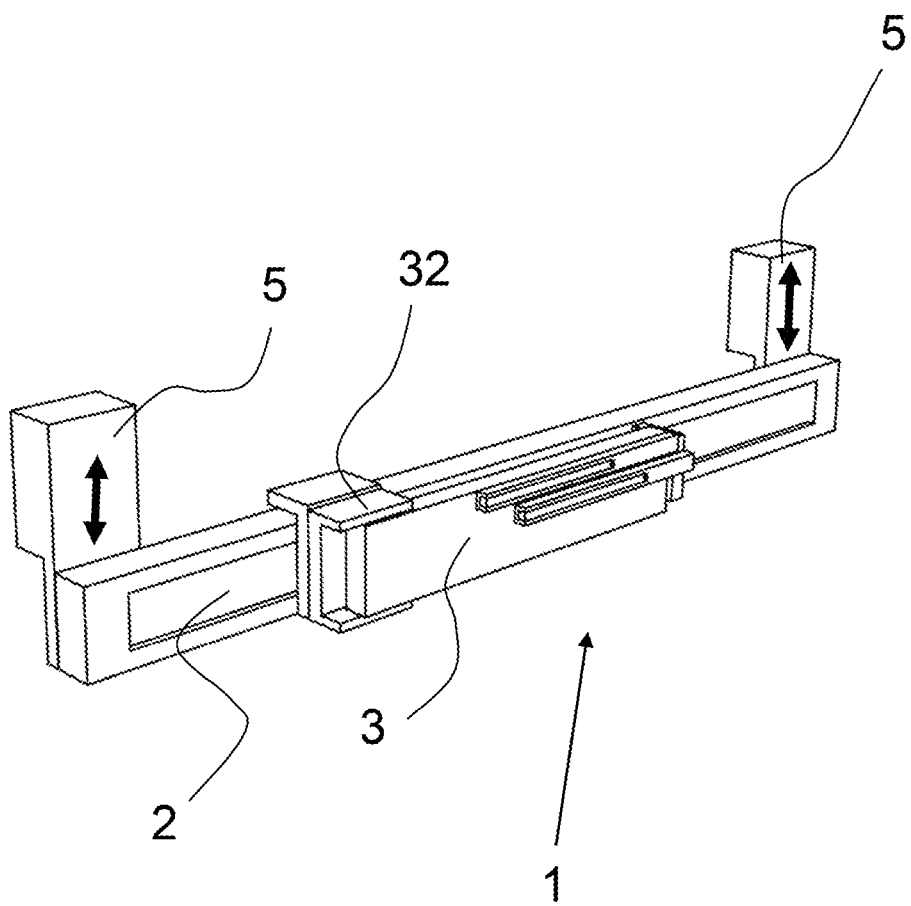
FIG. 36 is a perspective view of an embodiment of a maintenance apparatus as an alternative to the preceding drawings, which comprises two vertical drives.

FIG. 36 shows an alternative embodiment of a maintenance apparatus 1 which is intended for lifting especially heavy loads. For this purpose, the maintenance apparatus comprises two connecting units 5 to which the beam 2 is mounted.

Like in the embodiment illustrated above, the beam 2 can be driven upwards via connecting units 5, and the component located in the system can be lifted in this manner.

Arm 3 which corresponds to the previously described embodiment is pivotably mounted to the beam by means of a further connecting unit 32.

Connecting unit 32 is displaceable in the horizontal direction, in particular in motorized manner.

The vertical movement, however, is effected via connecting units 5.

Furthermore, the arm shown here is mounted for rotation via connecting unit 32, so that it can be pivoted into the system area or aligned vertically upwards or downwards for lifting heavy loads.

The invention in particular relates to a maintenance apparatus such as for components of a processing system or components of a process inspection system (for example a measurement sensor, components of a lithography system, in particular measurement devices, lithography devices, metrology devices, optical inspection devices, electron beam-based inspection devices, coating systems and systems for processing semiconductor substrates). The invention also relates to systems for producing masks for semiconductor processing. The invention furthermore relates to handling systems of the aforementioned systems, for example to handling robots. Furthermore, use thereof in systems within clean rooms of the pharmaceutical and food industry is also conceivable, in particular in production packaging and filling systems. Furthermore, use thereof in systems of the mechanical engineering industry is also possible.

Figure 37:
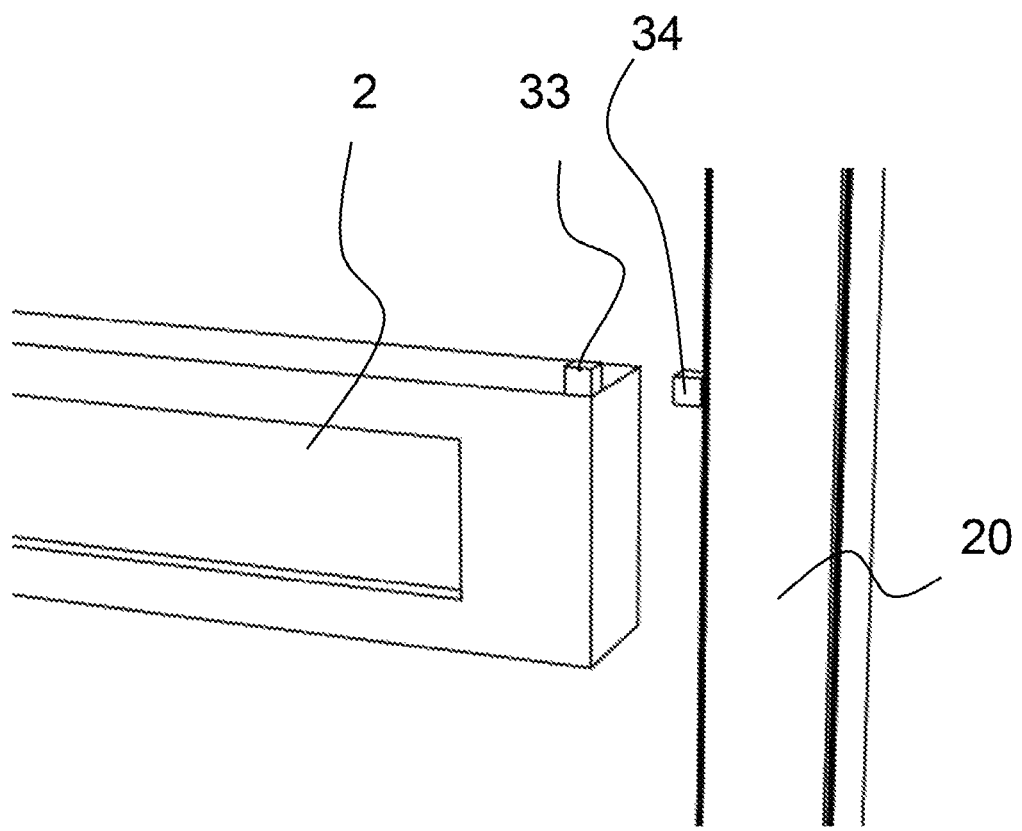
FIG. 37 is a view of a detail of a maintenance apparatus with a reader and a memory including teaching data.

FIG. 37 shows a view of a detail of a maintenance apparatus which comprises two components communicating with each other, in this exemplary embodiment a reader 33 and a memory 34. Memory 34 stores teaching data. Otherwise, the maintenance apparatus is configured like the maintenance apparatus illustrated in FIG. 1.

The maintenance apparatus comprises a beam 2, which can be mounted to the system, in particular using a quick-release clamp.

In this exemplary embodiment, a reader 33 is disposed on beam 2, which is able to read out, in wireless manner, a system-side memory 34 which is mounted to the frame 20 of the system in this exemplary embodiment. Memory 34 may in particular be designed as an RFID chip.

Via reader 33 it is now possible for the maintenance apparatus to be programmed with teaching data. In particular motion profiles for moving a specific system component out of the system area may be preprogrammed.

Figure 38:
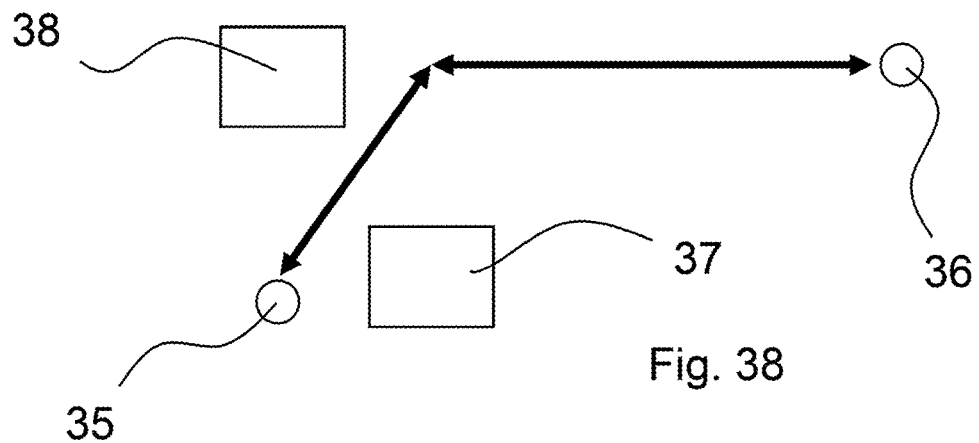
FIGS. 38 to 40 are intended to illustrate in more detail a method for moving components, for which a maintenance apparatus according to the invention is employed.
Figure 39:
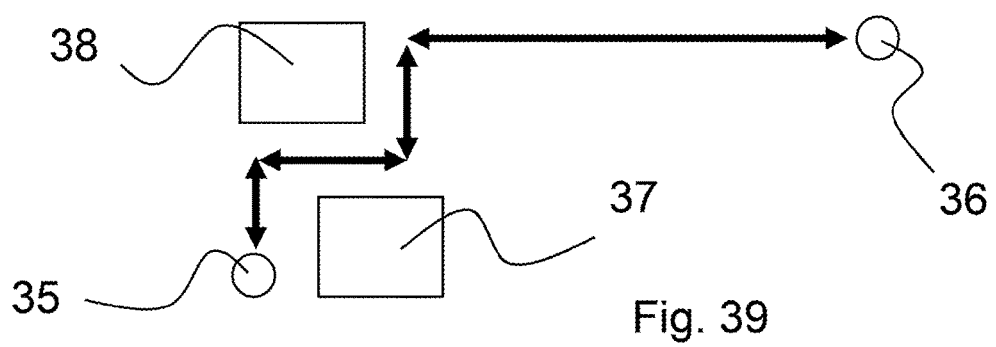
Figure 40:
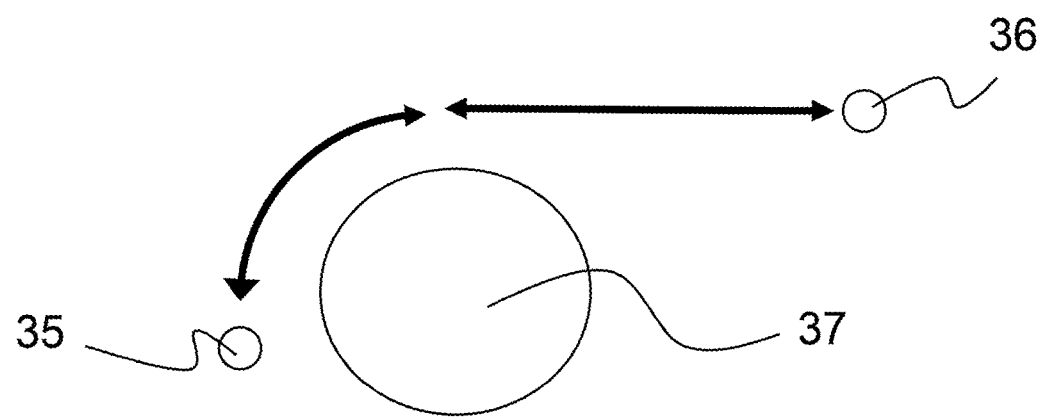

With reference to FIGS. 38 to 40 it will now be explained in which manner an exemplary embodiment of a maintenance apparatus of the invention is used for lifting a component and moving it out of a system area, which maintenance apparatus may in particular correspond to the maintenance apparatus shown in FIG. 1 and hence comprises a pivotable arm mounted to a beam, inter alia.

As schematically illustrated in FIG. 38, a component is to be moved from an initial position 35 to a final position 36.

The component has to be moved past obstacles 37 and 38 that are located along this way.

As can be seen, the movement from initial position 35 to final position 36 is composed of two linear, i.e. translational movements at an obtuse angle to one another.

The view relates to a movement in a plane which is defined by the horizontal and vertical axes, i.e. a vertical plane. In addition, a movement along a trajectory may also be performed in the third dimension, i.e. the horizontal plane, by including the pivoting movement into the trajectory control.

A trajectory is preferably composed of at least two translational movements.

As schematically illustrated in FIG. 39, the movement from an initial position 35 to a final position 36 may as well be composed of a plurality of translational movements perpendicular to each other.

However, as illustrated in FIG. 40, it is likewise possible according to one embodiment of the invention to first perform a rotational movement or circular movement starting from an initial position 35, and then to drive the component to the final position 36 in a translational movement. Such rotational movement or circular movement may for example be achieved by a combination of translational movements in order to avoid a substantially round obstacle 37.

The movement in a vertical plane, namely the x-z plane, as illustrated in FIGS. 38 to 40, may equally be applied to the other spatial directions, in particular to the horizontal plane, i.e. the x-y plane.

In the horizontal plane, a translational movement may be composed partially from the pivoting movement of the arm and a translational movement of the connecting unit of the maintenance apparatus.

The invention permits to provide a light-weight and portable lifting apparatus, which can be applied flexibly and which is even suitable for moving heavy loads.

LIST OF REFERENCE NUMERALS

1 Maintenance apparatus
2 Beam
3 Arm
3a, 3b Segment
4 Axis
5 Connecting unit

6 Beam seat
7 Arm seat
8 Fork
8b Upper portion
8a Lower portion
9 Rotation axis
10 Recess
11 Accommodation means
12-14 Arrows
15 Rotation axis
16 System for processing semiconductor devices
17 Table
18 Vibration isolator
19 Stage
20 Frame
21 Metrology device
22 Sensor
23 Filter module
24 Trolley case
25 Adapter
26 Lever
27 Cam
28 Recess
29 Arrow
30 Compensation joint
31 Sensor
32 Connecting unit
33 Reader
34 Memory with teaching data
35 Initial position
36 Final position
37 Obstacle
38 Obstacle
39 Actuator

What is claimed is:

1. A maintenance apparatus for lifting and moving components of a system for processing semiconductor devices, the maintenance apparatus comprising a beam and an arm with a component lifter, wherein the arm is connected to the beam via a connecting unit, wherein the arm is pivotable in a horizontal plane connected with the connecting unit, wherein the connecting unit is displaceable along the beam, wherein the arm is displaceable perpendicularly to the beam, wherein a load accommodation member for a component is placed on the pivotable arm, wherein the connecting unit comprises an arm seat and a beam seat, and wherein the arm seat is displaceable rectilinearly relative to the beam seat in a vertical direction.

2. The maintenance apparatus as claimed in claim 1, wherein the arm or the load accommodation member is detachable.

3. The maintenance apparatus as claimed in claim 1, wherein the arm is rotatable via the connecting unit.

4. The maintenance apparatus as claimed in claim 1, wherein the load accommodation member comprises fold-out forks for supporting the component.

5. The maintenance apparatus as claimed in claim 4, wherein the arm comprises a further load accommodation member for a component, which is arranged on a side of the arm facing away from the forks.

6. The maintenance apparatus as claimed in claim 4, wherein the fold-out forks are mounted to the arm so as to be rotatable or displaceable in a horizontal direction.

7. The maintenance apparatus as claimed in claim 1, wherein the maintenance apparatus is foldable.

8. A system for processing semiconductor devices, comprising a maintenance apparatus for lifting and moving components of the system, the maintenance apparatus comprising a beam and an arm with a component lifter, wherein the arm is connected to the beam via a connecting unit, wherein the arm is pivotable in a horizontal plane connected with the connecting unit, wherein the connecting unit is displaceable along the beam, wherein the arm is displaceable perpendicularly to the beam, wherein a load accommodation member for a component is placed on the pivotable arm, wherein the connecting unit comprises an arm seat and a beam seat, and wherein the arm seat is displaceable rectilinearly relative to the beam seat in a vertical direction.

9. The system as claimed in claim 8, wherein the maintenance apparatus can be mounted to the system by a quick-release clamping mechanism.

10. The system as claimed in claim 9, wherein the quick-release clamping mechanism includes an adapter which is mounted on a frame of the system.

11. The system as claimed in claim 8, comprising two maintenance apparatuses arranged diametrically opposite to each other.

12. The system as claimed in claim 8, wherein the maintenance apparatus is mounted to a frame of the system.

* * * * *